US011797118B2

(12) United States Patent
Yoo et al.

(10) Patent No.: US 11,797,118 B2
(45) Date of Patent: Oct. 24, 2023

(54) DISPLAY DEVICE WITH REFLECTIVE ELECTRODE AND CONNECTION ELECTRODE FORMED FROM A SAME METAL AND TOUCH INPUT SYSTEM INCLUDING THE SAME

(71) Applicant: SAMSUNG DISPLAY CO., LTD., Yongin-si (KR)

(72) Inventors: Gi Na Yoo, Cheonan-si (KR); Ju Yeon Kim, Asan-si (KR); Won Sang Park, Yongin-si (KR); Chang Woo Shim, Cheonan-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/819,932

(22) Filed: Aug. 15, 2022

(65) Prior Publication Data

US 2023/0214033 A1 Jul. 6, 2023

(30) Foreign Application Priority Data

Jan. 6, 2022 (KR) .......................... 10-2022-0001850

(51) Int. Cl.
*G06F 3/041* (2006.01)
*G06F 3/044* (2006.01)
*H10K 59/40* (2023.01)
*H10K 59/122* (2023.01)

(52) U.S. Cl.
CPC .......... *G06F 3/0412* (2013.01); *G06F 3/0442* (2019.05); *G06F 3/0446* (2019.05); *H10K 59/40* (2023.02); *H10K 59/122* (2023.02)

(58) Field of Classification Search
CPC .... G06F 3/0412; G06F 3/0442; G06F 3/0446; H10K 59/40; H10K 59/122
See application file for complete search history.

(56) References Cited

U.S. PATENT DOCUMENTS

| 2015/0123935 A1* | 5/2015 | Park | G06F 3/0448 345/174 |
| 2017/0364194 A1* | 12/2017 | Jang | H10K 59/131 |
| 2021/0408488 A1* | 12/2021 | Lu | H10K 71/00 |

FOREIGN PATENT DOCUMENTS

| CN | 108874220 | * 11/2018 |
| CN | 112447931 | 3/2021 |
| KR | 10-2019-0016635 | 2/2019 |
| KR | 10-2020-0033362 | 3/2020 |

* cited by examiner

*Primary Examiner* — Lisa S Landis
(74) *Attorney, Agent, or Firm* — F. CHAU & ASSOCIATES, LLC

(57) ABSTRACT

A display device includes a display unit that includes a plurality of light emitting areas; a plurality of touch electrodes disposed between the plurality of light emitting areas and that sense a touch; a light blocking member that forms a code pattern by covering a portion of a front surface of at least one of the plurality of touch electrodes with a preset code shape; and a reflective electrode formed on a rear surface of the light blocking member and that has an area that at least partially overlaps the light blocking member and reflects light from the front surface.

22 Claims, 23 Drawing Sheets

DISPLAY DEVICE WITH REFLECTIVE ELECTRODE AND CONNECTION ELECTRODE FORMED FROM A SAME METAL AND TOUCH INPUT SYSTEM INCLUDING THE SAME

CROSS-REFERENCE TO RELATED APPLICATION

This application claims priority under 35 U.S.C. 119 from Korean Patent Application No. 10-2022-0001850, filed on Jan. 6, 2022 in the Korean Intellectual Property Office, the contents of which are herein incorporated by reference in their entirety.

TECHNICAL FIELD

Embodiments of the present disclosure are directed to a display device and a touch input system that includes the same.

DISCUSSION OF THE RELATED ART

The demand for a display device for displaying an image is increasing in various forms. For example, display devices have been incorporated into various electronic devices, such as smartphones, digital cameras, laptop computers, navigation devices, and smart televisions. A display device may be a flat panel display device such as a liquid crystal display device, a field emission display device, or an organic light emitting display device. Of the flat panel display devices, a light emitting display device includes a light emitting element in which each pixel of a display panel emits light by itself, thereby displaying an image without a backlight unit that provides light to the display panel.

A recent display device supports a touch input that uses a portion of a user's body, such as a finger, and a touch input that uses an electronic pen. By sensing a touch input using an electronic pen, a display device can more precisely sense the touch input than when using only a touch input that uses a portion of a user's body.

SUMMARY

Embodiments of the present disclosure provide a display device that can process a touch input of a touch input device using code patterns of a display panel, and a touch input system that includes the same.

Embodiments of the present disclosure provide a display device with an improved structure of code patterns of a display panel so that a recognition rate can be improved, and a touch input system that includes the same.

According to an embodiment of the disclosure, a display device includes a display unit that includes a plurality of light emitting areas; a plurality of touch electrodes disposed between the plurality of light emitting areas and that sense a touch; a light blocking member that forms a code pattern by covering a portion of a front surface of at least one of the plurality of touch electrodes with a preset code shape; and a reflective electrode formed on a rear surface of the light blocking member and that has an area that at least partially overlaps the light blocking member and reflects light from the front surface.

In an embodiment, the code pattern has a planar shape of one of a closed loop shape of at least one of a rectangle, a square, a circle, or a rhombus, an open loop shape that partially surrounds at least one light emitting area of the plurality of light emitting areas, or a straight or curved shape of a preset length.

In an embodiment, the light blocking member includes an inorganic or organic black pigment that absorbs infrared or ultraviolet light, and covers a portion of the front surface and a portion of a side surface of the at least one touch electrode.

In an embodiment, the reflective electrode and a connection electrode are formed from a same metal through a same process on a rear surface of a process layer on which the light blocking member is formed, wherein the connection electrode electrically connects two touch electrodes of the plurality of touch electrodes, and the two touch electrodes of the plurality of touch electrodes are electrically connected to the connection electrode through a plurality of contact holes.

In an embodiment, the reflective electrode protrudes from at least one of an outer circumferential surface or an inner circumferential surface of the light blocking member in a plan view, and surrounds at least one of the outer or inner circumferential surfaces of the light blocking member.

In an embodiment, the reflective electrode protrudes from an outer circumferential surface of the light blocking member in at least one of first to fourth diagonal directions and upper, lower, left, or right directions of outer circumferential surfaces of the light blocking member in a plan view, and surrounds the outer circumferential surface of the light blocking member in at least one of the first to fourth diagonal directions and the upper, lower, left, or right directions of the outer circumferential surfaces of the light blocking member.

In an embodiment, the reflective electrode protrudes from an inner circumferential surface of the light blocking member in at least one of first to fourth diagonal directions and upper, lower, left, or right directions of inner circumferential surfaces of the light blocking member in a plan view, and surrounds the inner circumferential surface of the light blocking member in at least one of the first to fourth diagonal directions and the upper, lower, left, or right directions of the inner circumferential surfaces of the light blocking member.

In an embodiment, the reflective electrode is electrically separated from the plurality of touch electrodes and the connection electrode and is maintained in a floating state.

In an embodiment, the reflective electrode has a width in at least one of first to fourth diagonal directions and upper, lower, left, or right directions that is greater than a width of the light blocking member, and surrounds all of the inner and outer circumferential surfaces of the light blocking member in the first to fourth diagonal directions and the upper, lower, left, and right directions in a plan view.

In an embodiment, the reflective electrode has a width in at least one of first to fourth diagonal directions and upper, lower, left, or right directions that is greater than a width of the light blocking member, and surrounds an outer circumferential surface of the light blocking member in at least one of the first to fourth diagonal directions and the upper, lower, left, or right directions in a plan view.

In an embodiment, the reflective electrode has a width in at least one of first to fourth diagonal directions and upper, lower, left, or right directions that is greater than a width of the light blocking member, and surrounds an inner circumferential surface of the light blocking member in at least one of the first to fourth diagonal directions and the upper, lower, left, or right directions in a plan view.

In an embodiment, the reflective electrode has the same width as the light blocking member, has an area that partially overlaps the light blocking member, and protrudes from outer circumferential surfaces of the light blocking member in first to fourth diagonal directions and upper, lower, left, or right directions and surrounds the outer circumferential surfaces in a plan view.

In an embodiment, the reflective electrode has the same width as the light blocking member, has an area that partially overlaps the light blocking member, and protrudes from inner circumferential surfaces of the light blocking member in first to fourth diagonal directions and upper, lower, left, or right directions and surrounds the inner circumferential surfaces in a plan view.

In an embodiment, the reflective electrode has a curved shape that protrudes in at least one of first to fourth diagonal directions and upper, lower, left, and right directions from an outer circumferential surface of the light blocking member in a plan view, and surrounds the outer circumferential surface of the light blocking member with a semicircular shape or a convex curved shape in at least one direction in a plan view.

In an embodiment, the reflective electrode has a curved shape that protrudes in at least one of first to fourth diagonal directions and upper, lower, left, and right directions from an inner circumferential surface of the light blocking member in a plan view, and surrounds the inner circumferential surface of the light blocking member with a semicircular shape or a convex curved shape in at least one direction in a plan view.

In an embodiment, the reflective electrode has a circular or polygonal shape, and the circular or polygonal shape protrudes in at least one direction from an outer circumferential surface of a corner of the light blocking member in a plan view, and the circular or polygonal shape surrounds the outer circumferential surface of at least one corner of the light blocking member.

In an embodiment, the reflective electrode surrounds an inner circumferential surface of the corner of the light blocking member in at least one direction with a sectoral-circular shape.

In an embodiment, the reflective electrode has a width that is greater than a width of the light blocking member, and the circular or polygonal shaped reflective electrode protrudes from the outer circumferential surface and the inner circumferential surface of at least one corner of the light blocking member in all directions in a plan view, and the circular or polygonal shape surrounds the outer circumferential surface and the inner circumferential surface of at least one corner of the light blocking member.

According to an embodiment of the disclosure, a touch input system includes a display device that displays an image; and a touch input device that inputs a touch to the display device. The display device includes a display unit that includes a plurality of light emitting areas; a plurality of touch electrodes disposed between the plurality of light emitting areas that that sense a touch; a light blocking member that forms a code pattern by covering a portion of a front surface of at least one of the plurality of touch electrodes with a preset code shape; and a reflective electrode formed on a rear surface of the light blocking member and that has an area that partially overlaps the light blocking member and reflects light from the touch input device.

In an embodiment, the touch input device includes a code detection unit that detects the code pattern; a code processor that receives shape data for the code pattern, extracts a data code that corresponds to a shape of the code pattern, and generates coordinate data that correspond to the data code; and a communication module that transmits the coordinate data to the display device.

According to an embodiment of the disclosure, a touch input system includes a display device that displays an image and includes a light blocking member that forms a code pattern; and a touch input device that inputs a touch to the display device. The touch input device includes a code detection unit that detects the code pattern; a code processor that receives shape data of the code pattern, extracts a data code that corresponds to a shape of the code pattern, and generates coordinate data that corresponds to the data code; and a communication module that transmits the coordinate data to the display device.

In an embodiment, the display device includes a display unit that includes a plurality of light emitting areas; a plurality of touch electrodes disposed between the plurality of light emitting areas and that sense a touch; and a reflective electrode formed on a rear surface of the light blocking member and that has an area that partially overlaps the light blocking member and reflects light from the touch input device. The light blocking member forms the code pattern by covering a portion of a front surface of at least one of the plurality of touch electrodes with a preset code shape.

According to a display device and a touch input system including the same according to embodiments, touch coordinate data of the touch input device are generated using code patterns of the display panel without complicated calculations and corrections, and a touch input of the touch input device is processed. In particular, a touch input function is performed that produces accurate input coordinates, reduces cost and power consumption, and simplifies a driving process.

Further, according to a display device and a touch input system including the same according to embodiments, a code pattern recognition rate and display panel code information are increased through an improved code pattern structure that includes a light blocking pattern and a reflective pattern disposed around the light blocking pattern.

DETAILED DESCRIPTION

Embodiments of the present disclosure will now be described more fully hereinafter with reference to the accompanying drawings, in which embodiments of the disclosure are shown.

It will also be understood that when a layer is referred to as being "on" another layer or substrate, it can be directly on the other layer or substrate, or intervening layers may also be present. The same reference numbers may indicate the same components throughout the specification.

Hereinafter, embodiments will be described with reference to the accompanying drawings.

Figure 1:
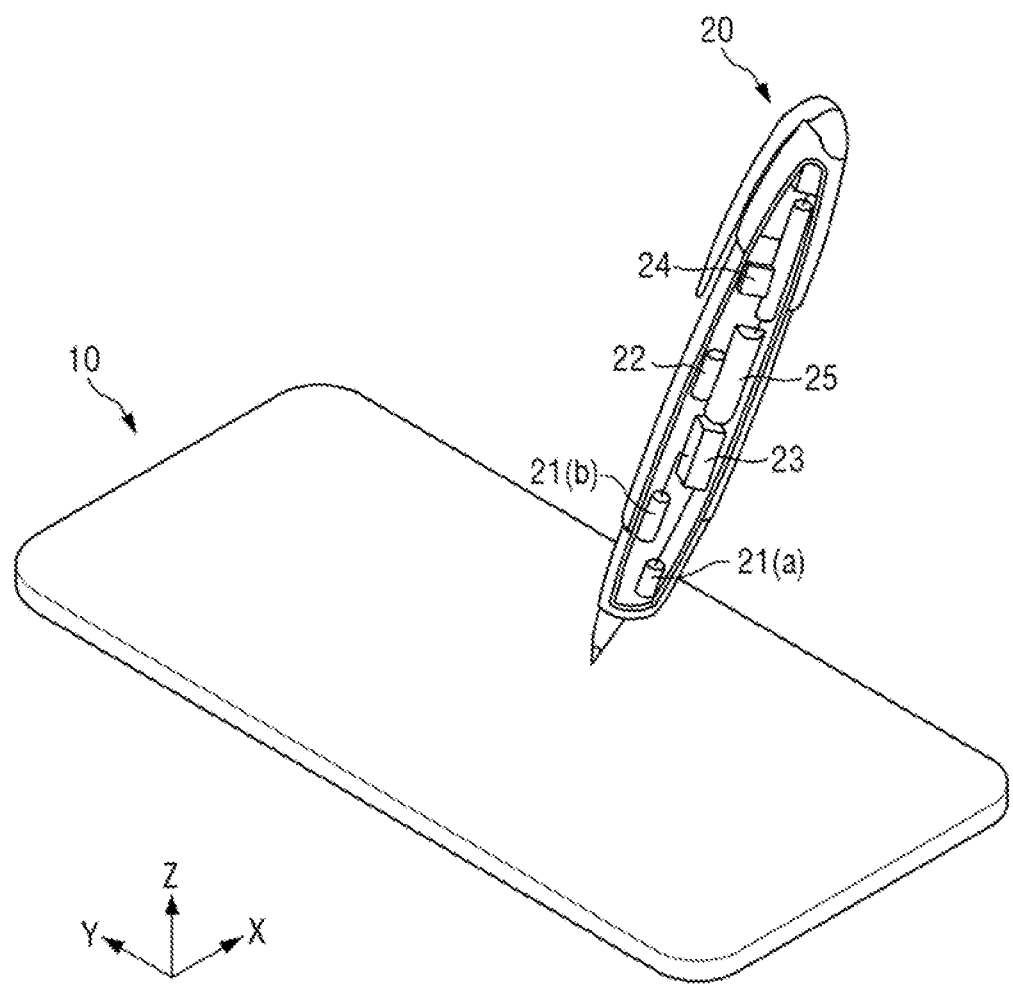
FIG. 1 illustrates a touch input system according to an embodiment of the present disclosure.
Figure 2:
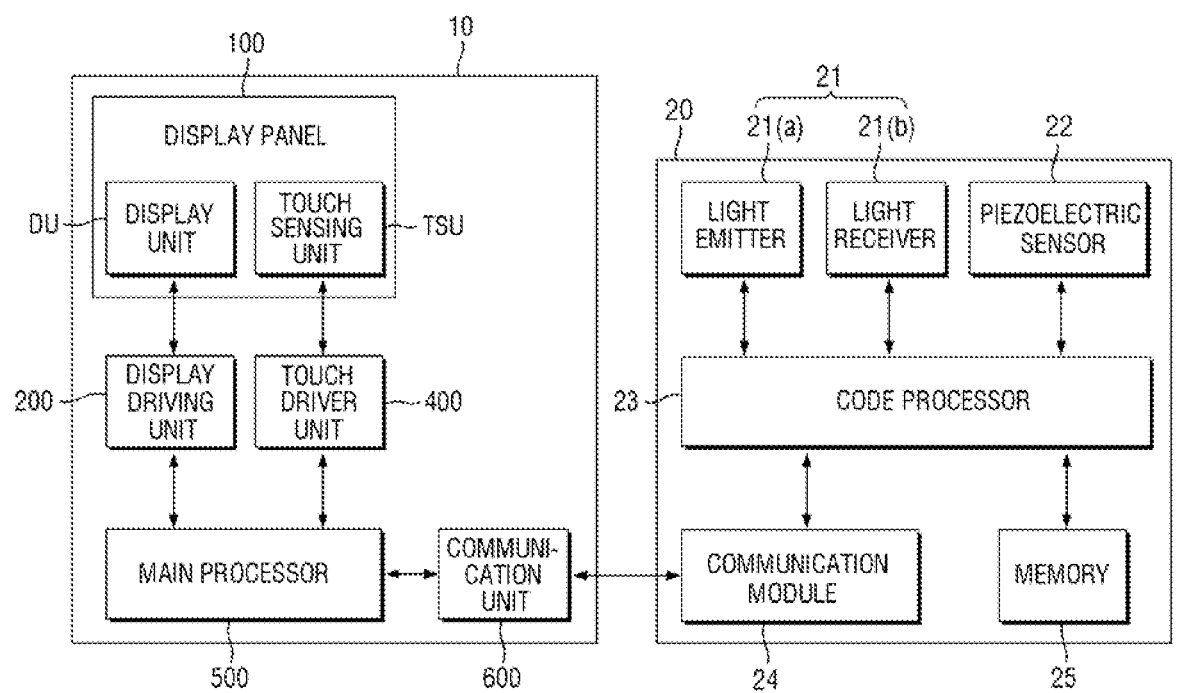
FIG. 2 is a block diagram of a touch input device and a display device illustrated in FIG. 1.

FIG. 1 illustrates a touch input system according to an embodiment of the present disclosure. FIG. 2 is a block diagram of a touch input device and a display device illustrated in FIG. 1.

Referring to FIGS. 1 and 2, in an embodiment, a display device 10 can be incorporated into portable electronic devices such as mobile phones, smartphones, tablet personal computers (PCs), mobile communication terminals, electronic notebooks, electronic books, portable multimedia players (PMPs), navigation devices, and ultra mobile PCs (UMPCs). For example, the display device 10 can be incorporated into display units of televisions, laptop computers, monitors, billboards, or the Internet of Things (JOT). For another example, the display device 10 can be incorporated into wearable devices such as smart watches, watch phones, glasses-type displays, and head mounted displays (HMDs).

The display device 10 includes a display panel 100, a display driving unit (a driving circuit) 200, a touch driving unit (a driving circuit) 400, a main processor (a processing circuit) 500, and a communication unit (a communication circuit) 600. In addition, a touch input device 20 includes a code detection unit (a detection circuit) 21, a piezoelectric sensor (a sensing circuit) 22, a code processor (a processing circuit) 23, a communication module (a communication circuit) 24, and a memory (a memory circuit) 25.

The display device 10 uses the touch input device 20 as a touch input mechanism. The display panel 100 of the display device 10 includes a display unit (a display circuit) DU that displays an image, and a touch sensing unit TSU (a sensing circuit) that senses a human body part such as a finger or the touch input device 20. The display unit DU includes a plurality of pixels and displays an image through the plurality of pixels.

The touch sensing unit TSU of the display panel 100 is disposed on a front surface of the display panel 100, where the front surface is the surface through which an image is displayed. The touch sensing unit TSU includes a plurality of touch electrodes that sense a user's touch using a capacitance type sensing. Code patterns are formed on some of the plurality of touch electrodes, and the code patterns are sensed by the touch input device 20.

The code patterns of the display panel 100 include a light blocking member that forms a planar code shape by covering some of the plurality of touch electrodes in a predetermined area. In addition, the code patterns include a reflective electrode formed on a rear surface of the light blocking member, where the rear surface faces away from the front surface of the display panel 100. The reflective electrode overlaps some areas of the light blocking member according to the planar code shape of the light blocking member. Accordingly, the code patterns are sensed by the touch input device 20 according to the planar code shape of the light blocking member and a size of a planar code. The reflective member is formed on a rear layer (or lower layer) of the light blocking member, and protrudes from at least one of an inner circumferential surface or an outer circumferential surface of the light blocking member. Since the reflective member protrudes from at least one side surface of the light blocking member as a front shape, the detection and recognition rate of a dark light blocking member is increased by light reflecting from the reflective member. The detailed structures of the code patterns as well as the touch sensing unit TSU of the display panel 100 will be described below in more detail with reference to the accompanying drawings.

The display driving unit 200 outputs signals and voltages that drive the display unit DU. The display driving unit 200 supplies data voltages to data lines. The display driving unit 200 supplies a power voltage to a power line and supplies a gate control signal to a gate driving unit.

The touch driving unit 400 is connected to the touch sensing unit TSU. The touch driving unit 400 supplies a touch driving signal to a plurality of touch electrodes of the touch sensing unit TSU, and senses an amount of a capacitance change between the plurality of touch electrodes. The touch driving unit 400 calculates whether a user's touch input has occurred and touch coordinates based on the amount of capacitance change between the plurality of touch electrodes.

The main processor 500 controls all functions of the display device 10. For example, the main processor 500 supplies digital video data to the display driving unit 200 so that the display panel 100 displays an image. For example, the main processor 500 receives touch data from the touch driving unit 400 to determine the user's touch coordinates, generates digital video data according to the touch coordinates, or executes an application indicated by an icon displayed at the user's touch coordinates. For another example, the main processor 500 receives coordinate data from the touch input device 20 to determine the touch coordinates of the touch input device 20, generates digital video data according to the touch coordinates, or executes an application indicated by an icon displayed at the touch coordinates of the touch input device 20.

The communication unit 600 performs wired/wireless communications with an external device. For example, the communication unit 600 transmits/receives communication signals to and from the communication module 24 of the touch input device 20. The communication unit 600 receives coordinate data composed of data codes from the touch input device 20, and provides the coordinate data to the main processor 500.

The touch input device 20 is a touch input mechanism and is an electronic pen such as a smart pen. An electronic pen detects display light of the display panel 100 or light reflected from the display panel 100 using an optical type, detects a code pattern included in the display panel 100 based on the sensed light, and generates coordinate data. The touch input device 20 may be an electronic pen in the shape of a writing instrument, but is not necessarily limited to the shape or structure of a writing instrument.

Referring to FIGS. 1 and 2, in an embodiment, the code detection unit 21 of the touch input device 20 is disposed adjacent to a pen tip of the touch input device 20 to detect code patterns in the display panel 100 of the display device 10. To this end, the code detection unit 21 includes a light emitting unit 21(*a*) that emits infrared light using at least one infrared light source, and a light receiving unit 21(*b*) that detects infrared light reflected from code patterns of a code pattern unit with an infrared camera.

At least one infrared light source in the light emitting unit 21(*a*) is an infrared LED array that has a matrix structure. In addition, the infrared camera of the light receiving unit 21(*b*) includes a filter that blocks wavelength bands other than infrared light and allows the infrared light to pass therethrough, a lens system that focuses infrared light that have passed through the filter, and an optical image sensor that converts an optical image formed by the lens system into an electrical image signal and outputs the converted image signal. Like the infrared LED array, the optical image sensor is an array that has a matrix structure that provides shape data of the code patterns to the code processor 23 according to an infrared shape reflected from the code patterns of the code pattern unit. In this way, the code detection unit 21 of the touch input device 20 can continuously detect the code pattern units in some areas of the touch sensing unit TSU according to the user's control and movement, and continuously generate the shape data of the code patterns to provide the generated shape data to the code processor 23.

The code processor 23 continuously receives the shape data of the code pattern unit from the code detection unit 21. For example, the code processor 23 continuously receives the shape data for the code patterns in the code pattern unit, and identifies the arrangement structure and shape of the code patterns. The code processor 23 extracts or generates a data code that corresponds to the arrangement structure and shape of the code patterns, and extracts or generates coordinate data that corresponds to the combined data code by combining the data codes. The code processor 23 transmits the generated coordinate data to the display device 10 through the communication module 24. In particular, the code processor 23 receives the shape data of the code pattern unit and generates and converts the data codes that correspond to the code patterns, respectively, thereby quickly generating the coordinate data without a complicated calculation and correction.

The communication module 24 performs wired/wireless communication with an external device. For example, the communication module 24 transmits/receives communication signals to and from the communication unit 600 of the display device 10. The communication module 24 receives the coordinate data composed of the data codes from the code processor 23, and provides the coordinate data to the communication unit 600.

The memory 25 stores data that drives the touch input device 20. The memory 25 stores shape data of the code patterns and data codes that correspond to the respective shape data and code patterns. In addition, the memory 25 stores data codes and coordinate data according to a combination of data codes. The memory 25 shares, with the code processor 23, the data codes that correspond to the respective shape data and code patterns, and the coordinate data according to the combination of the data codes. Accordingly, the code processor 23 combine the data codes through the data codes and the coordinate data stored in the memory 25, and extract or generate coordinate data that correspond to the combined data code.

Figure 3:
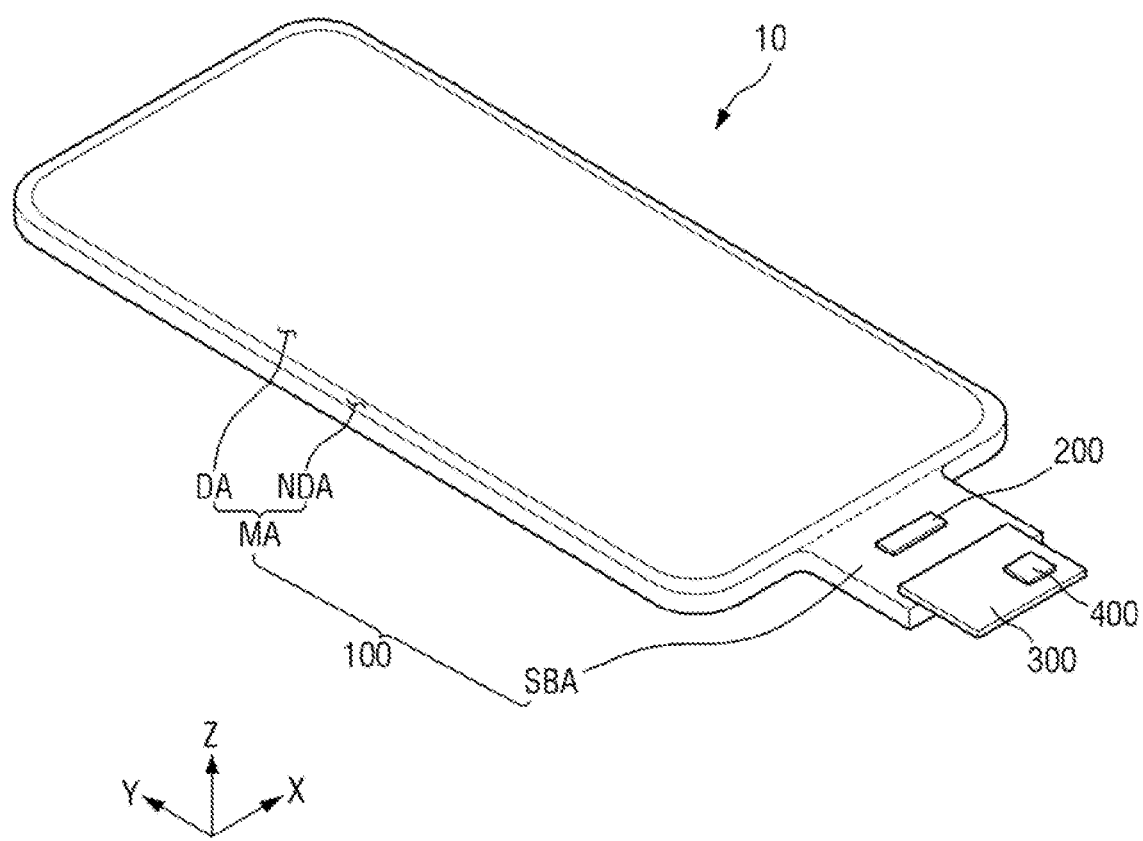
FIG. 3 is a perspective view of a display device illustrated in FIG. 2.

FIG. 3 is a perspective view of the display device illustrated in FIG. 2. In addition, FIG. 4 is a cross-sectional view of the display device illustrated in FIG. 2.

Figure 4:
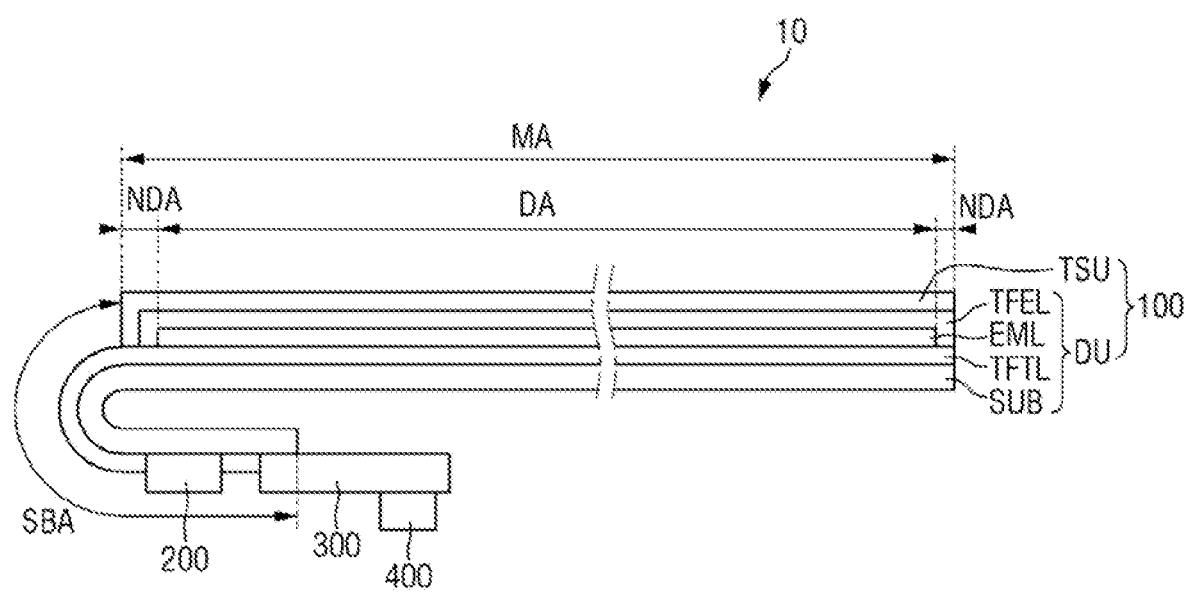
FIG. 4 is a cross-sectional view of a display device illustrated in FIG. 2.

Referring to FIGS. 3 and 4, in an embodiment, the display device 10 has a planar shape similar to a rectangle. For example, the display device 10 has a planar shape similar to a rectangle with a short side in an X-axis direction and a long side in a Y-axis direction. A corner where the short side and the long side meet may be rounded to have a predetermined curvature or may be formed at a right angle. The planar shape of the display device 10 is not limited to a rectangle, and may be formed similar to other shapes, such as polygons, circles, or ovals.

The display panel 100 includes a main area MA and a sub-area SBA.

The main area MA includes a display area DA that includes pixels that display an image, and a non-display area NDA disposed around the display area DA. The display area DA emits light from a plurality of light emitting areas or a plurality of openings. For example, the display panel 100 includes a pixel circuit that includes switching elements, a pixel defining layer that defines a light emitting area or an opening, and a self-emitting light element.

The non-display area NDA is outside the display area DA. The non-display area NDA is an edge area of the main area MA of the display panel 100. The non-display area NDA includes a gate driving unit that supplies gate signals to the gate lines, and fan-out lines that connect the display driving unit 200 and the display area DA.

The sub-area SBA extends from one side of the main area MA. The sub-area SBA includes a flexible material that can be bent, folded, rolled, etc. For example, when the sub-area SBA is bent, the sub-area SBA overlaps the main area MA in a thickness direction, which is a Z-axis direction. The sub-area SBA includes the display driving unit 200 and a pad portion connected to a circuit board 300. In an embodiment, the sub-area SBA is omitted, and the display driving unit 200 and the pad portion are disposed in the non-display area NDA.

The display driving unit 200 is formed as an integrated circuit (IC) and may be mounted on the display panel 100 by a chip on glass (COG) method, a chip on plastic (COP) method, or an ultrasonic bonding method. For example, the display driving unit 200 is disposed in the sub-area SBA, and overlaps the main area MA in the thickness direction when the sub-area SBA is bent. For another example, the display driving unit 200 is mounted on the circuit board 300.

The circuit board 300 is attached to the pad portion of the display panel 100 using an anisotropic conductive film (ACF). Lead wires of the circuit board 300 are electrically connected to the pad portion of the display panel 100. The circuit board 300 is a flexible film such as a flexible printed circuit board, a printed circuit board, or a chip on film.

The touch driving unit 400 is mounted on the circuit board 300. The touch driving unit 400 is formed as an integrated circuit (IC). As described above, the touch driving unit 400 supplies the touch driving signal to the plurality of touch electrodes of the touch sensing unit TSU, and senses the amount of capacitance change between the plurality of touch electrodes. The touch driving signal is a pulse signal having a predetermined frequency. The touch driving unit 400 calculates whether a touch input has occurred and touch coordinates based on the amount of capacitance change between the plurality of touch electrodes.

Referring to FIG. 4, in an embodiment, the display panel 100 includes a display unit (a display circuit) DU, a touch sensing unit (a sensing circuit) TSU, and a polarizing film. The display unit DU includes a substrate SUB, a thin film transistor layer TFTL, a light emitting element layer EML, and an encapsulation layer TFEL.

The substrate SUB is a base substrate or a base member. The substrate SUB is a flexible substrate that can be bent, folded, and rolled. For example, the substrate SUB includes a glass or a metal, but is not necessarily limited thereto. For another example, the substrate SUB includes a polymer resin such as polyimide PI.

The thin film transistor layer TFTL is disposed on the substrate SUB. The thin film transistor layer TFTL includes a plurality of thin film transistors that constitute a pixel circuit of pixels. The thin film transistor layer TFTL further includes gate lines, data lines, power lines, gate control lines, fan-out lines that connect the display driving unit 200 and the data lines, and lead lines that connect the display driving unit 200 and the pad portion. When the gate driving unit is formed on one side of the non-display area NDA of the display panel 100, the gate driving unit also includes the thin film transistors.

The thin film transistor layer TFTL is disposed in the display area DA, the non-display area NDA, and the sub-area SBA. The thin film transistors, the gate lines, the data lines, and the power lines of each of the pixels of the thin film transistor layer TFTL are disposed in the display area DA. The gate control lines and the fan-out lines of the thin film transistor layer TFTL are disposed in the non-display area NDA. The lead lines of the thin film transistor layer TFTL are disposed in the sub-area SBA.

The light emitting element layer EML is disposed on the thin film transistor layer TFTL. The light emitting element layer EML includes a plurality of light emitting elements in which a first electrode, a light emitting layer, and a second electrode are sequentially stacked to emit light, and a pixel defining layer that defines pixels. The plurality of light emitting elements of the light emitting element layer EML are disposed in the display area DA. The light emitting layer is an organic light emitting layer that includes an organic material. The light emitting layer includes a hole transporting layer, an organic light emitting layer, and an electron transporting layer. When the first electrode receives a predetermined voltage through the thin film transistor of the thin film transistor layer (TFTL), and the second electrode receives a cathode voltage, holes and electrons move to the organic light emitting layer through the hole transporting layer and the electron transporting layer, respectively, and combine with each other in the organic light emitting layer to emit light. For example, the first electrode is an anode electrode and the second electrode is a cathode electrode, but embodiments are not necessarily limited thereto.

For another example, the plurality of light emitting elements may include a quantum dot light emitting diode that includes a quantum dot light emitting layer or an inorganic light emitting diode that includes an inorganic semiconductor.

The encapsulation layer TFEL covers a top surface and side surfaces of the light emitting element layer EML, and protects the light emitting element layer EML. The encapsulation layer TFEL includes at least one inorganic layer and at least one organic layer that encapsulate the light emitting element layer EML.

The touch sensing unit TSU is disposed on the encapsulation layer TFEL. The touch sensing unit TSU includes a plurality of touch electrodes that sense a user's touch in a capacitance manner, and touch lines that connect the plurality of touch electrodes and the touch driving unit 400. For example, the touch sensing unit TSU senses a user's touch in a self-capacitance manner or a mutual capacitance manner.

For another example, the touch sensing unit TSU is disposed on a separate substrate that is disposed on the display unit DU. The substrate that supports the touch sensing unit TSU is a base member that encapsulates the display unit DU.

The plurality of touch electrodes of the touch sensing unit TSU are disposed in a touch sensor area that overlaps the display area DA. The touch lines of the touch sensing unit TSU are disposed in a touch peripheral area that overlaps the non-display area NDA.

The sub-area SBA of the display panel 100 extends from one side of the main area MA. The sub-area SBA includes a flexible material that can be bent, folded, rolled, etc. For example, when the sub-area SBA is bent, the sub-area SBA overlaps the main area MA in a thickness direction. The sub-area SBA includes the display driving unit 200 and a pad portion connected to a circuit board 300.

Figure 5:
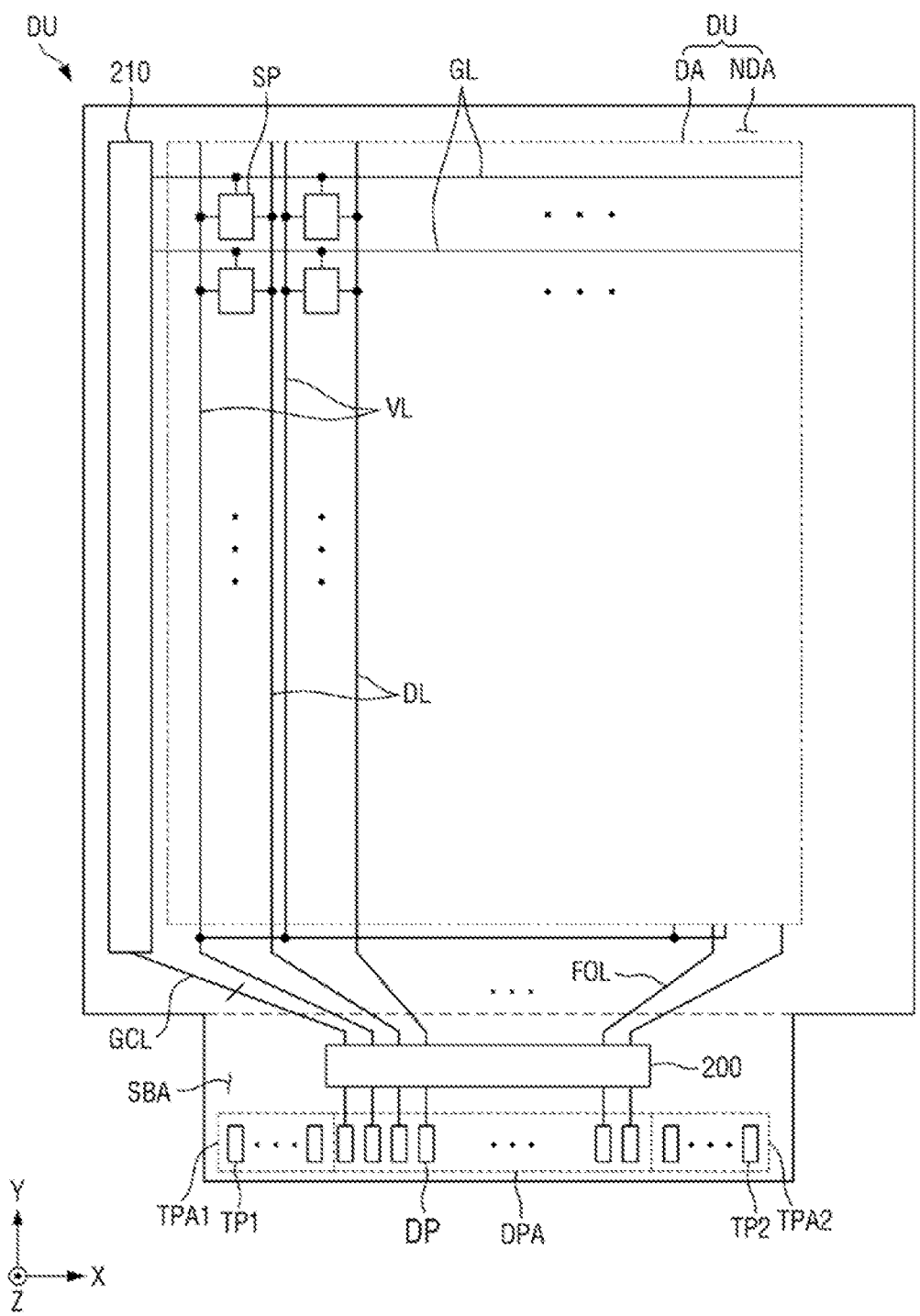
FIG. 5 is a plan view of a display unit of a display device according to an embodiment.

FIG. 5 is a plan view of a display unit of a display device according to an embodiment.

Referring to FIG. 5, in an embodiment, the display area DA of the display unit DU is an area that displays an image and is a central area of the display panel 100. The display area DA includes a plurality of pixels SP, a plurality of gate lines GL, a plurality of data lines DL, and a plurality of power lines VL. Each of the plurality of pixels SP is a minimum unit for outputting light.

The plurality of gate lines GL supply gate signals received from a gate driving unit (a driving circuit) 210 to the plurality of pixels SP. The plurality of gate lines GL extend in the X-axis direction and are spaced apart from each other in the Y-axis direction that intersects the X-axis direction.

The plurality of data lines DL supply data voltages received from the display driving unit 200 to the plurality of pixels SP. The plurality of data lines DL extend in the Y-axis direction and are spaced apart from each other in the X-axis direction.

The plurality of power lines VL supply a power voltage received from the display driving unit 200 to the plurality of pixels SP. The power voltage is at least one of a driving voltage, an initialization voltage, or a reference voltage. The plurality of power lines VL extend in the Y-axis direction and are spaced apart from each other in the X-axis direction.

The non-display area NDA of the display unit DU surrounds the display area DA. The non-display area NDA includes the gate driving unit 210, fan-out lines FOL, and gate control lines GCL. The gate driving unit 210 generates a plurality of gate signals based on a gate control signal, and sequentially supplies the plurality of gate signals to the plurality of gate lines GL according to a set order.

The fan-out lines FOL extend from the display driving unit 200 to the display area DA. The fan-out lines FOL supply the data voltages received from the display driving unit 200 to the plurality of data lines DL.

The gate control line GCL extends from the display driving unit 200 to the gate driving unit 210. The gate control line GCL supply the gate control signal received from the display driving unit 200 to the gate driving unit 210.

The sub-area SBA includes the display driving unit 200, a display pad area DPA, and first and second touch pad areas TPA1 and TPA2.

The display driving unit 200 outputs to the fan-out lines FOL signals and voltages that drive the display panel 100. The display driving unit 200 supplies the data voltages through the fan-out lines FOL to the data lines DL. The data voltages are supplied to the plurality of pixels SP and determine luminance of the plurality of pixels SP. The display driving unit 200 supplies the gate control signal through the gate control line GCL to the gate driving unit 210.

The display pad area DPA, the first touch pad area TPA1, and the second touch pad area TPA2 are disposed at edges of the sub-area SBA. The display pad area DPA, the first touch pad area TPA1, and the second touch pad area TPA2 are electrically connected to the circuit board 300 using an anisotropic conductive film or a low-resistance and high-reliability material such as a SAP (superabsorbent polymer).

The display pad area DPA includes a plurality of display pad portions DP. The plurality of display pad portions DP are connected to the main processor 500 through the circuit board 300. The plurality of display pad portions DP are connected to the circuit board 300 and receive digital video data, and supply the digital video data to the display driving unit 200.

Figure 6:
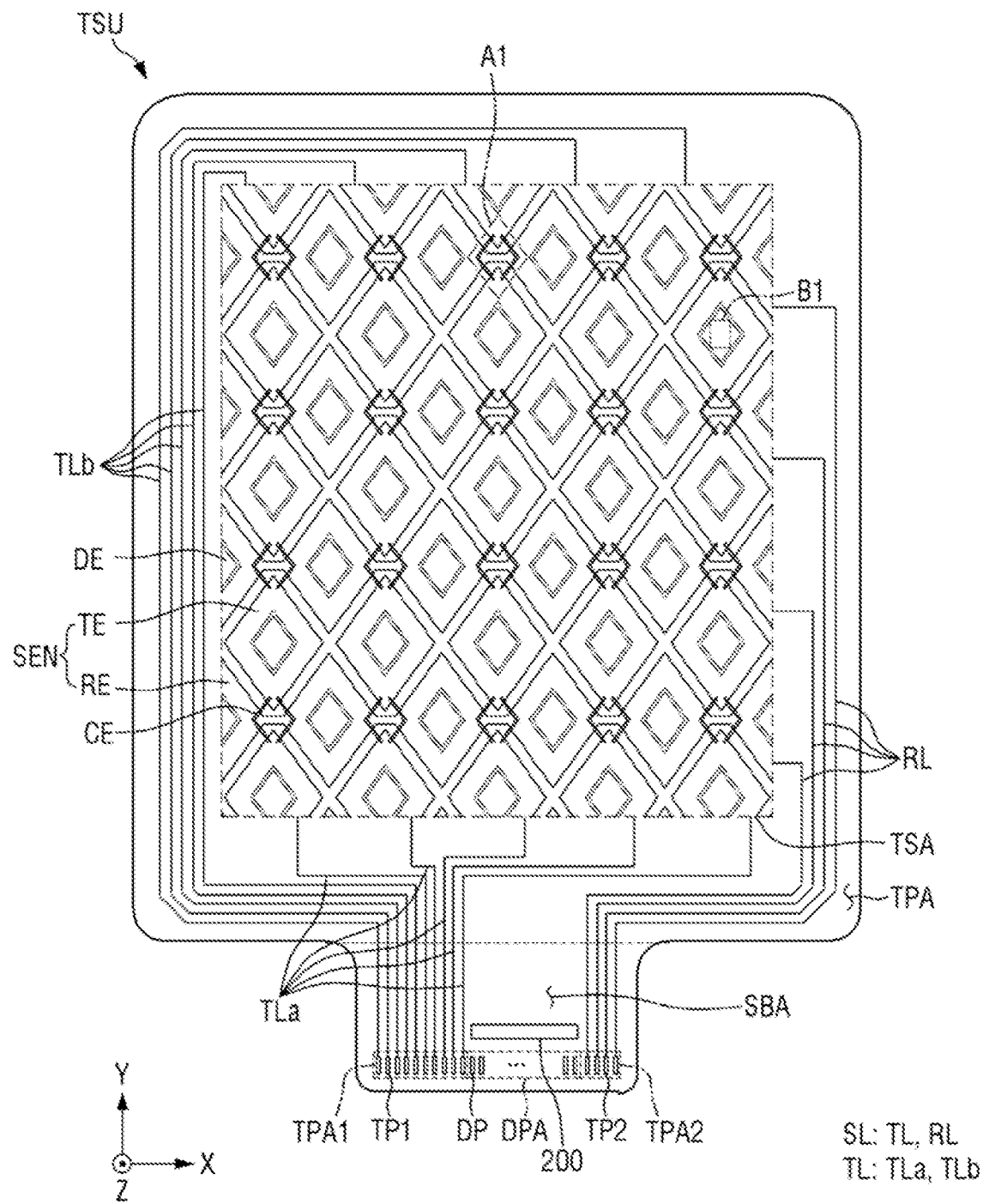
FIG. 6 is a plan view of a touch sensing unit of a display device according to an embodiment.

FIG. 6 is a plan view of a touch sensing unit of a display device according to an embodiment.

Referring to FIG. 6, in an embodiment, the touch sensing unit TSU includes a touch sensor area TSA that senses a user's touch, and a touch peripheral area TPA disposed around the touch sensor area TSA. The touch sensor area TSA overlaps the display area DA of the display unit DU, and the touch peripheral area TPA overlaps the non-display area NDA of the display unit DU.

The touch sensor area TSA includes a plurality of touch electrodes SEN and a plurality of dummy electrodes DE. The plurality of touch electrodes SEN form mutual capacitance or self capacitance to sense a touch of an object or a person. The plurality of touch electrodes SEN include a plurality of driving electrodes TE and a plurality of sensing electrodes RE.

The plurality of driving electrodes TE are arranged in the X-axis direction and the Y-axis direction. The plurality of driving electrodes TE are spaced apart from each other in the X-axis direction and the Y-axis direction. The driving electrodes TE adjacent to each other in the Y-axis direction are electrically connected to each other through a plurality of connection electrodes CE.

The plurality of driving electrodes TE are connected to a first touch pad portion TP1 through a driving line TL. The driving line TL includes a lower driving line TLa and an upper driving line TLb. For example, some of the driving electrodes TE disposed on a lower side of the touch sensor area TSA are connected to the first touch pad portion TP1 through the lower driving line TLa, and other driving electrodes TE disposed on an upper side of the touch sensor area TSA are connected to the first touch pad portion TP1 through the upper driving line TLb. The lower driving line TLa pass through a lower side of the touch peripheral area TPA and extend to the first touch pad portion TP1. The upper driving line TLb extend to the first touch pad portion TP1 through upper, left, and lower sides of the touch peripheral area TPA. The first touch pad portion TP1 are connected to the touch driving unit 400 through the circuit board 300.

The connection electrode CE id bent at least once. For example, the connection electrode CE has a clamp shape ("<" or ">"), but the shape of the connection electrode CE in a plan view is not necessarily limited thereto. The driving electrodes TE adjacent to each other in the Y-axis direction are electrically connected to each other by a plurality of connection electrodes CE, and even if one of the plurality of connection electrodes CE is disconnected, the driving electrodes TE can be stably connected to each other through the remaining connection electrodes CE. Adjacent driving electrodes TE are connected by two connection electrodes CE, but the number of connection electrodes CE is not necessarily limited thereto.

The connection electrodes CE are disposed on a different layer from the plurality of driving electrodes TE and the plurality of sensing electrodes RE. The sensing electrodes RE adjacent to each other in the X-axis direction are electrically connected to each other through a connection portion disposed on the same layer as the plurality of driving electrodes TE or the plurality of sensing electrodes RE. For example, the plurality of sensing electrodes RE extend in the X-axis direction and are spaced apart from each other in the Y-axis direction. The plurality of sensing electrodes RE are arranged in the X-axis direction and the Y-axis direction, and the sensing electrodes RE adjacent to each other in the X-axis direction are electrically connected to each other through the connection portion.

The driving electrodes TE adjacent to each other in the Y-axis direction are electrically connected to each other through the connection electrodes CE disposed on different layers from the plurality of driving electrodes TE or the plurality of sensing electrodes RE. The connection electrodes CE are formed on a rear layer (or a lower layer) of a layer on which the driving electrodes TE and the sensing electrodes RE are formed. The connection electrodes CE are electrically connected to the adjacent driving electrodes TE through a plurality of contact holes. Accordingly, even if the connection electrodes CE overlap the plurality of sensing electrodes RE in the Z-axis direction, the plurality of driving electrodes TE and the plurality of sensing electrodes RE are insulated from each other. Mutual capacitances form between the driving electrode TE and the sensing electrode RE.

Since the connection electrodes CE are formed on the rear or lower layer of the layer on which the driving electrodes TE and the sensing electrodes RE are formed, the connection electrodes CE are formed on the same layer as the reflective electrodes of the respective code patterns. Accordingly, the reflective electrodes of the respective code patterns are formed on the same layer using the same metal as the connection electrodes CE through the same process. The connection electrodes CE and the reflective electrodes are formed and disposed on the same layer through the same process, but are physically and electrically separated from each other.

The plurality of sensing electrodes RE are connected to a second touch pad portion TP2 through a sensing line RL. For example, at least some of the sensing electrodes RE disposed on the right side of the touch sensor area TSA are connected to the second touch pad portion TP2 through the sensing line RL. The sensing line RL extends to the second touch pad portion TP2 through the right and lower sides of the touch peripheral area TPA. The second touch pad portion TP2 is connected to the touch driving unit 400 through the circuit board 300.

Each of the plurality of dummy electrodes DE is surrounded by a driving electrode TE or a sensing electrode RE. Each of the plurality of dummy electrodes DE is spaced apart from and insulated from the driving electrode TE or the sensing electrode RE. Accordingly, the dummy electrode DE electrically floats.

Light blocking members that form a preset planar code shape are formed on some areas of a front surface of at least one of the plurality of driving electrodes TE, the plurality of sensing electrodes RE, and the plurality of dummy electrodes DE. Reflective electrodes formed according to the planar code shape of the light blocking member are positioned on a rear layer of a layer on which the light blocking members are formed.

The display pad area DPA, the first touch pad area TPA1, and the second touch pad area TPA2 are disposed at edges of the sub-area SBA. The display pad area DPA, the first touch pad area TPA1, and the second touch pad area TPA2 are electrically connected to the circuit board 300 using an anisotropic conductive film or a low-resistance and high-reliability material such as a SAP.

The first touch pad area TPA1 is disposed on one side of the display pad area DPA and includes a plurality of first touch pad portions TP1. The plurality of first touch pad portions TP1 are electrically connected to the touch driving unit 400 disposed on the circuit board 300. The plurality of first touch pad portions TP1 supply a touch driving signal to the plurality of driving electrodes TE through the plurality of driving lines TL.

The second touch pad area TPA2 is disposed on the other side of the display pad area DPA and includes a plurality of second touch pad portions TP2. The plurality of second touch pad portions TP2 are electrically connected to the touch driving unit 400 disposed on the circuit board 300. The touch driving unit 400 receives a touch sensing signal through the plurality of sensing lines RL connected to the plurality of second touch pad portions TP2, and senses a change in mutual capacitance between the driving electrode TE and the sensing electrode RE.

For another example, the touch driving unit 400 supplies a touch driving signal to each of the plurality of driving electrodes TE and the plurality of sensing electrodes RE, and receives a touch sensing signal from each of the plurality of driving electrodes TE and the plurality of sensing electrodes RE. The touch driving unit 400 senses a charge change amount of each of the plurality of driving electrodes TE and the plurality of sensing electrodes RE based on the touch sensing signal.

Figure 7:
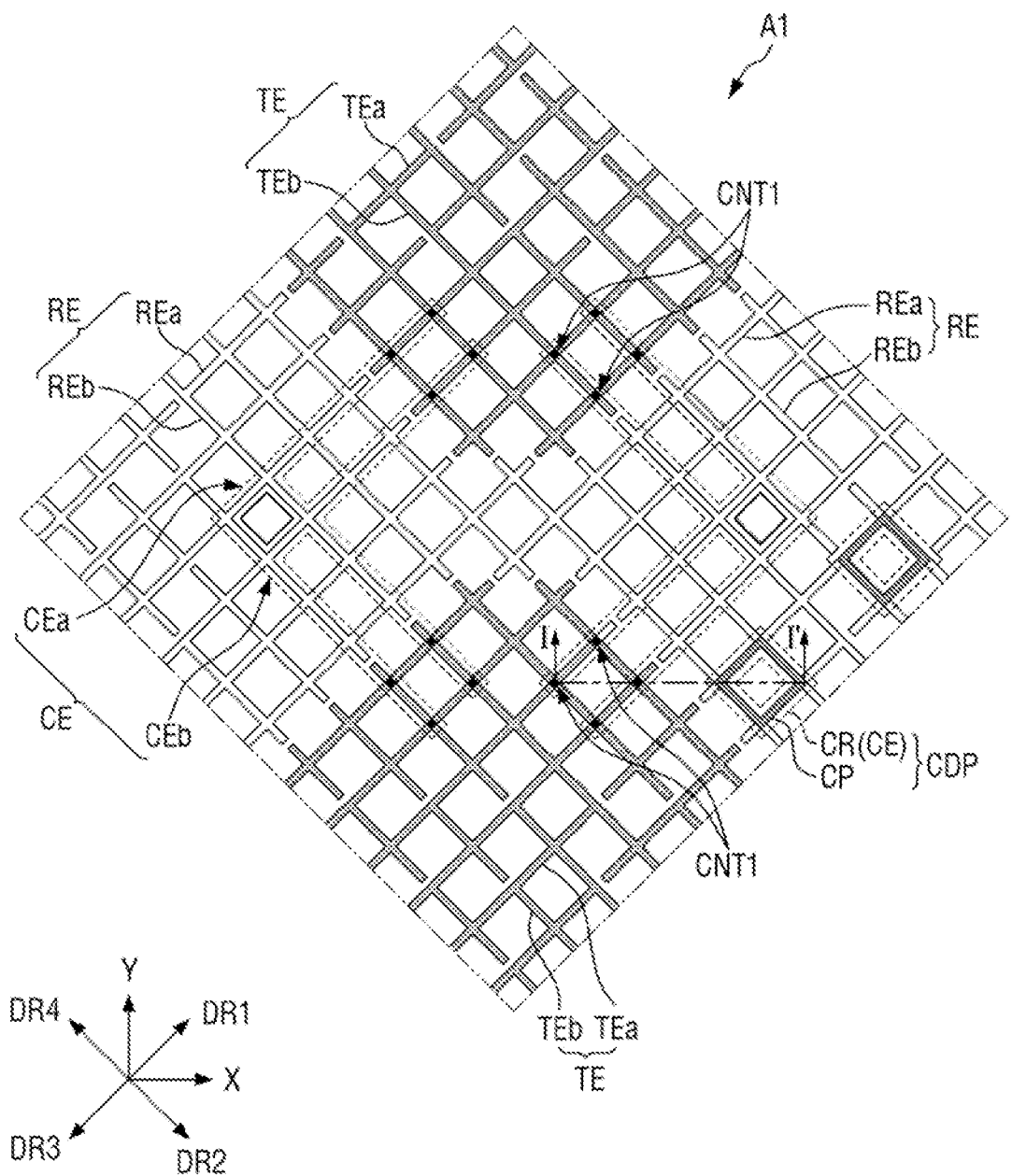
FIG. 7 is an enlarged view of area A1 in FIG. 6.
Figure 8:
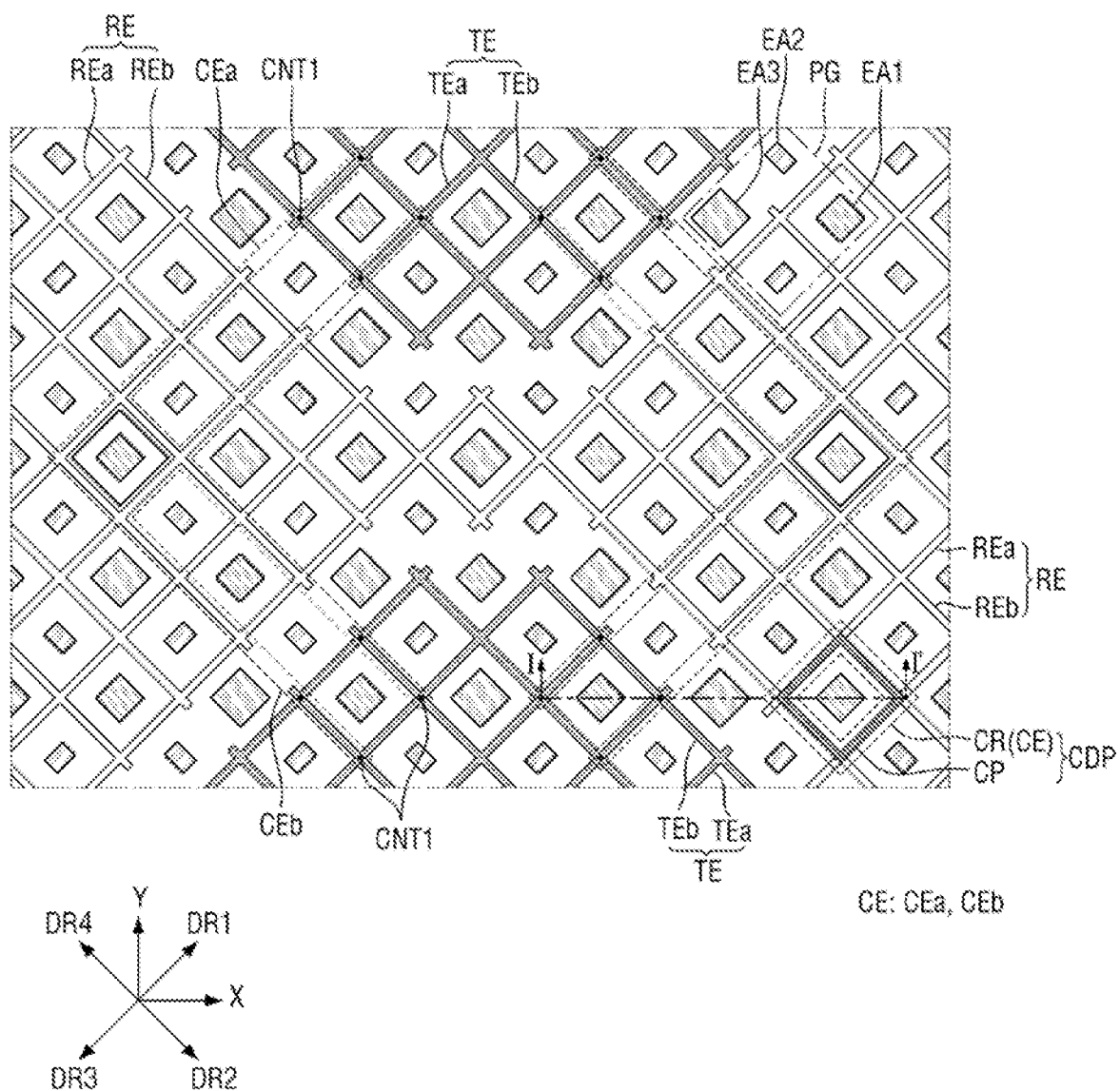
FIG. 8 is an enlarged view of a code pattern unit and a portion of an area A1 according to an embodiment.

FIG. 7 is an enlarged view of area A1 in FIG. 6. In addition, FIG. 8 is an enlarged view of a code pattern unit and a portion of an area A1 according to an embodiment.

Referring to 7 and 8, in an embodiment, the plurality of driving electrodes TE, the plurality of sensing electrodes RE, and the plurality of dummy electrodes DE are disposed on the same layer and are spaced apart from each other.

The plurality of driving electrodes TE are arranged in the X-axis direction and the Y-axis direction. The plurality of driving electrodes TE are spaced apart from each other in the X-axis direction and the Y-axis direction. The driving electrodes TE adjacent to each other in the Y-axis direction are electrically connected to each other through the connection electrodes CE.

The plurality of sensing electrodes RE extend in the X-axis direction and are spaced apart from each other in the Y-axis direction. The plurality of sensing electrodes RE are arranged in the X-axis direction and the Y-axis direction, and the sensing electrodes RE adjacent to each other in the X-axis direction are electrically connected to each other. For example, the sensing electrodes RE are electrically connected to each other through a connection portion, and the connection portion is disposed within the shortest distance between adjacent driving electrodes TE.

The plurality of connection electrodes CE are disposed on a different layer from the driving electrode TE and the sensing electrode RE, such as a rear layer. The connection electrode CE includes a first portion CEa and a second portion CEb. For example, the first portion CEa of the connection electrode CE is connected to the driving electrode TE on one side through a first contact hole CNT1 and extends in the third direction DR3. The second portion CEb of the connection electrode CE is bent from the first portion CEa in an area that overlaps the sensing electrode RE and extends in the second direction DR2, and is connected to the driving electrode TE on the other side through the first contact hole CNT1. Hereinafter, the first direction DR1 refers to a direction between the X-axis direction and the Y-axis direction, the second direction DR2 refers to a direction that is substantially perpendicular to the first direction DR1, the third direction DR3 refers to a direction opposite to the first direction DR1, and the fourth direction DR4 refers to a direction opposite to the second direction DR2. Accordingly, each of the plurality of connection electrodes CE connects the driving electrodes TE adjacent to each other in the Y-axis direction.

The plurality of pixels include first to third sub-pixels, and each of the first to third sub-pixels respectively includes first to third light emitting areas EA1, EA2, and EA3. For example, the first light emitting area EA1 emits light of a first color, such as red light, the second light emitting area EA2 emits light of a second color, such as green light, and the third light emitting area EA3 emits light of a third color, such as blue light. In an embodiment, the plurality of pixels include first to third sub-pixels or first to fourth sub-pixels, and each of the first to fourth sub-pixels includes first to fourth light emitting areas, but embodiments are not necessarily limited thereto.

One pixel group PG expresses a white grayscale through the first to third light emitting areas EA1 to EA3 or the first to fourth light emitting areas EA1 to EA4. In addition, grayscales of various colors, such as white, are expressed by a combination of light emitted from the first to third light emitting areas EA1 to EA3 or the first to fourth light emitting areas EA1 to EA4.

According to an arrangement structure of the first to third sub-pixels or the first to fourth sub-pixels, the plurality of driving electrodes TE, the plurality of sensing electrodes RE, and the plurality of dummy electrodes DE are formed in a mesh structure or a net structure in a plan view.

The plurality of driving electrodes TE, the plurality of sensing electrodes RE, and the plurality of dummy electrodes DE surround each of the first to third light emitting areas EA1, EA2, and EA3 of the pixel group PG in a plan view. Therefore, the plurality of driving electrodes TE, the plurality of sensing electrodes RE, and the plurality of dummy electrodes DE do not overlap the first to third light emitting areas EA1, EA2, and EA3. The plurality of connection electrodes CE also do not overlap the first to third light emitting areas EA1, EA2, and EA3. Therefore, the display device 10 prevents luminance of the light emitted from the first to third light emitting areas EA1, EA2, and EA3 from being reduced by the touch sensing unit TSU.

Each of the plurality of driving electrodes TE includes a first portion TEa that extends in the first direction DR1 and a second portion TEb that extends in the second direction DR2 and that do not overlap the first to third light emitting areas EA1, EA2, and EA3. In addition, each of the plurality of sensing electrodes RE includes a first portion REa that extends in the first direction DR1 and a second portion REb that extends in the second direction DR2 and that do not overlap the first to third light emitting areas EA1, EA2, and EA3.

Code patterns CDP are formed in the touch sensing unit TSU at predetermined intervals, such as intervals of about 300 μm.

The code patterns CDP include a light blocking member CP that forms a planar code by covering some areas of the front surface of at least one of the plurality of driving electrodes TE, the plurality of sensing electrodes RE, and the plurality of dummy electrodes DE with a planar code shape that has a preset size. In addition, a reflective electrode CR is disposed on the rear surface of the light blocking members CP, and the reflective electrode CR has at least some areas thereof that overlap the rear surface of the light blocking member CP according to a planar cord shape of the light blocking member CP. A position code shape of the code patterns CDP is determined by the planar code shape of the light blocking member CP.

The light blocking member CP is formed by covering some areas of the front surface (or upper surface) of at least one of the plurality of driving electrodes TE, the plurality of sensing electrodes RE, and the plurality of dummy electrodes DE with the planar code shape. The light blocking member CP covers not only a portion of the front surface of each electrode, but also at least one side surface along with the front surface.

The planar code shape of the light blocking member CP have a closed loop shape such as a rectangle, a square, a circle, or a rhombus. In an embodiment, the planar code shape of the light blocking member CP has an open loop shape that partially surrounds one light emitting area. In addition, in an embodiment, the planar code shape of the light blocking member CP is a straight line or curved shape that has a preset length. However, when the light blocking member CP surrounds both between and outside the plurality of light emitting areas instead of one light emitting area, an overall shape of the light blocking member CP is a mesh structure or a net structure in a plan view. Hereinafter, an example in which the planar shape of the light blocking member CP has a rhombus shape that forms a closed loop will be described.

The reflective electrode CR is formed on a different process layer from the plurality of driving electrodes TE, the plurality of sensing electrodes RE, and the plurality of dummy electrodes DE. As described above, the reflective electrode CR is formed of the same material as the connection electrode CE through the same process as the connection electrode CE when the connection electrode CE is formed. Accordingly, the reflective electrode CR is positioned on a rear (or lower) layer of the layer on which the light blocking member CP is formed, and has at least some areas that overlap the rear surface of the light blocking member CP according to the size and the planar code shape of the light blocking member CP. In particular, the reflective electrode CR protrudes from at least one of the outer circumferential surface or the inner circumferential surface of the light blocking member CP in a plan view, and surrounds at least one surface along at least one of the outer circumferential surface or the inner circumferential surface of the light blocking member CP.

Specifically, the reflective electrode CR protrudes from an outer circumferential surface of the light blocking member CP in at least one of the first to fourth directions DR1 to DR4 and the upper, lower, left, or right directions of the outer circumferential surfaces of the light blocking member CP in a plan view, and surrounds the outer circumferential surface in at least one of the first to fourth directions DR1 to DR4 and the upper, lower, left, or right directions of the outer circumferential surfaces of the light blocking member CP. In addition, the reflective electrode CR protrudes from an inner circumferential surface of the light blocking member CP in at least one of the first to fourth directions DR1 to DR4 and the upper, lower, left, or right directions of the inner circumferential surfaces of the light blocking member CP in a plan view, and surrounds the inner circumferential surface in at least one of the first to fourth directions DR1 to DR4 and the upper, lower, left, or right directions of the inner circumferential surfaces of the light blocking member CP.

For example, as illustrated in FIG. 8, the reflective electrode CR protrudes from the outer circumferential surfaces of the light blocking member CP in the first to fourth directions DR1 to DR4 and the upper, lower, left, and right directions in a plan view, and surrounds all of the outer circumferential surfaces of the light blocking member CP in the first to fourth directions DR1 to DR4 and the upper, lower, left, and right directions. In this case, the reflective electrode CR protrudes from the inner circumferential surfaces of the light blocking member CP in the first to fourth directions DR1 to DR4, and surrounds all of the inner circumferential surfaces of the light blocking member CP in the first to fourth directions DR1 to DR4 as well. As described above, by the reflective electrode CR more widely protruding to at least one outer circumferential side or at least one inner circumferential side of the light blocking member CP in a plan view to reflect light of the front surface, a difference between an amount of light reflected from the light blocking member CP and an amount of light reflected from the reflective electrode CR is increased. Accordingly, identification sensitivity of the touch input device 20 for the light blocking member CP is increased, and a recognition rate of the light blocking member CP is increased.

Figure 9:
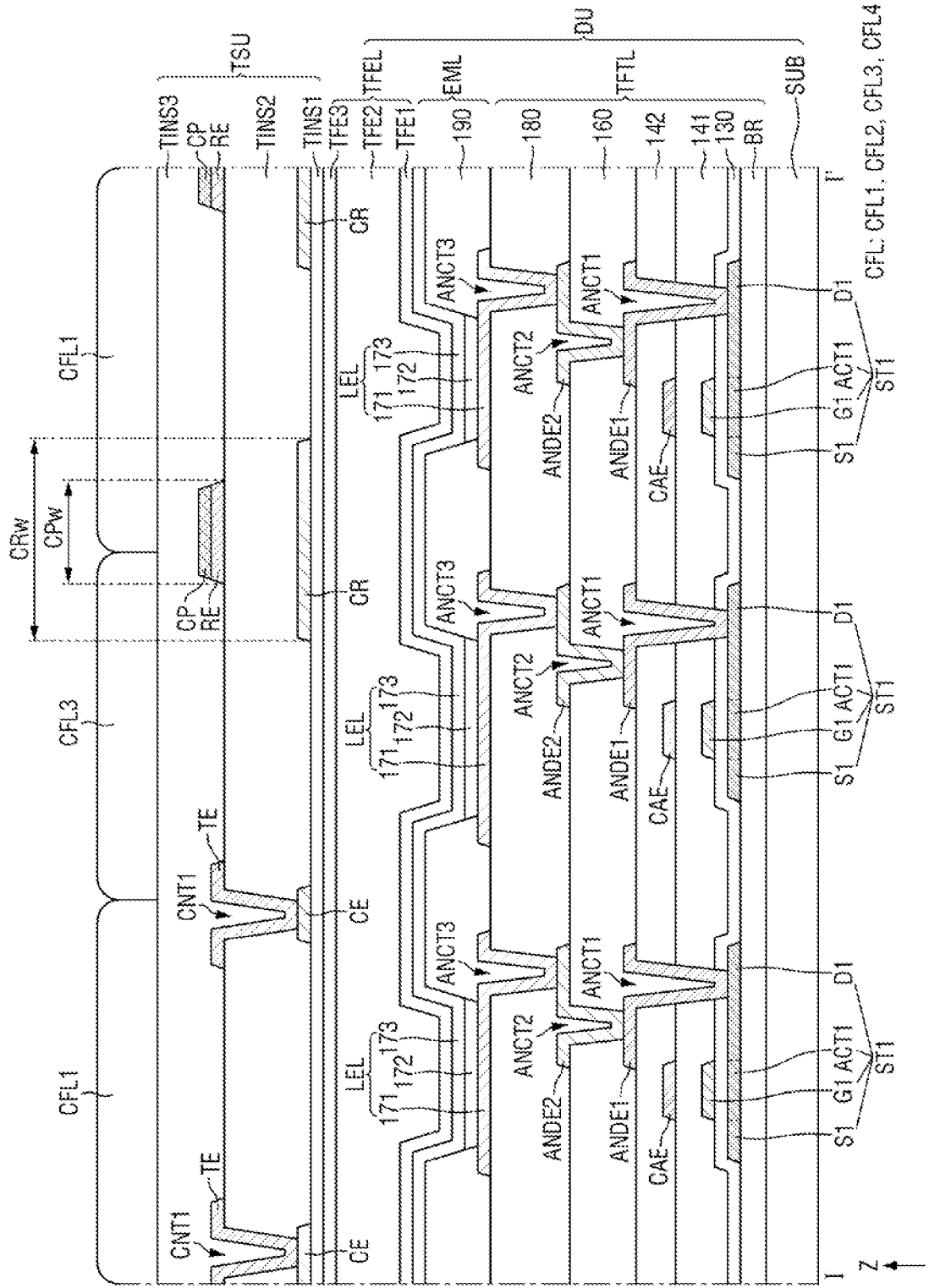
FIG. 9 is a cross-sectional view taken along line I-I' of FIG. 8.

FIG. 9 is a cross-sectional view taken along line I-I' of FIG. 8.

Referring to FIG. 9, in an embodiment, a barrier layer BR is disposed on the substrate SUB. The substrate SUB is made of an insulating material such as a polymer resin. For example, the substrate SUB is made of polyimide. The substrate SUB is a flexible substrate that can be bent, folded, and rolled.

The barrier layer BR protects the transistors of the thin film transistor layer TFTL and the light emitting layer 172 of the light emitting element layer EML from moisture that penetrates through the substrate SUB, which is vulnerable to moisture permeation. The barrier layer BR is made of a plurality of inorganic layers that are alternately stacked. For example, the barrier layer BR is formed as multiple layers in which one or more inorganic layers of a silicon nitride layer, a silicon oxynitride layer, a silicon oxide layer, a titanium oxide layer, or an aluminum oxide layer are alternately stacked.

Thin film transistors ST1 are disposed on the barrier layer BR. Each thin film transistor ST1 includes an active layer ACT1, a gate electrode G1, a source electrode S1, and a drain electrode D1.

The active layer ACT1, the source electrode S1, and the drain electrode D1 of each of the thin film transistors ST1 are disposed on the barrier layer BR. The active layer ACT1 of the thin film transistor ST1 includes at least one of polycrystalline silicon, single crystal silicon, low-temperature polycrystalline silicon, amorphous silicon, or an oxide semiconductor. The active layer ACT1 overlaps the gate electrode G1 in the third direction (Z-axis direction), which is the thickness direction of the substrate SUB, and is a channel area. The source electrode S1 and the drain electrode D1 do not overlap the gate electrode G1 in the third direction (Z-axis direction), and are conductive due to doping a silicon semiconductor or an oxide semiconductor with ions or impurities.

A gate insulating layer 130 is disposed on the barrier layer BR and on the active layer ACT1, the source electrode S1, and the drain electrode D1 of the thin film transistor ST1. The gate insulating layer 130 is formed of an inorganic layer, such as at least one of a silicon nitride layer, a silicon oxynitride layer, a silicon oxide layer, a titanium oxide layer, or an aluminum oxide layer.

The gate electrode G1 of the thin film transistor ST1 is disposed on the gate insulating layer 130. The gate electrode G1 overlaps the active layer ACT1 in the third direction (Z-axis direction). The gate electrode G1 may have a single layer or multiple layers made of any one of molybdenum (Mo), aluminum (Al), chromium (Cr), gold (Au), titanium (Ti), nickel (Ni), neodymium (Nd), or copper (Cu), or alloys thereof.

A first interlayer insulating layer 141 is disposed on the gate insulating layer 130 and the gate electrode G1 of the thin film transistor ST1. The first interlayer insulating layer 141 is formed of an inorganic layer, such as at least one of a silicon nitride layer, a silicon oxynitride layer, a silicon oxide layer, a titanium oxide layer, or an aluminum oxide layer. The first interlayer insulating layer 141 may be formed of a plurality of inorganic layers.

A capacitor electrode CAE is disposed on the first interlayer insulating layer 141. The capacitor electrode CAE overlaps the gate electrode G1 of the first thin film transistor ST1 in the third direction (Z-axis direction). Since the first interlayer insulating layer 141 has a predetermined dielectric constant, a capacitor is formed by the capacitor electrode CAE, the gate electrode G1, and the first interlayer insulating layer 141 disposed between the capacitor electrode CAE and the gate electrode G1. The capacitor electrode CAE may have a single layer or multiple layers made of any one of molybdenum (Mo), aluminum (Al), chromium (Cr), gold (Au), titanium (Ti), nickel (Ni), neodymium (Nd), or copper (Cu), or alloys thereof.

A second interlayer insulating layer 142 is disposed on the capacitor electrode CAE and the first interlayer insulating layer 141. The second interlayer insulating layer 142 is formed of an inorganic layer, such as a silicon nitride layer, a silicon oxynitride layer, a silicon oxide layer, a titanium oxide layer, or an aluminum oxide layer. The second interlayer insulating layer 142 may be formed of a plurality of inorganic layers.

A first anode connection electrode ANDE1 is disposed on the second interlayer insulating layer 142. The first anode connection electrode ANDE1 is connected to the drain electrode D1 of the thin film transistor ST1 through a first connection contact hole ANCT1 that penetrates through the gate insulating layer 130, the first interlayer insulating layer 141, and the second interlayer insulating layer 142. The first anode connection electrode ANDE1 is has a single layer or multiple layers made of any one of molybdenum (Mo), aluminum (Al), chromium (Cr), gold (Au), titanium (Ti), nickel (Ni), neodymium (Nd), or copper (Cu), or alloys thereof.

A first planarization layer 160 that planarizes steps caused by the thin film transistor ST1 is disposed on the first anode connection electrode ANDE1 and the second interlayer insulating layer 142. The first planarization layer 160 is an organic layer made of at least one of an acryl resin, an epoxy resin, a phenolic resin, a polyamide resin, or a polyimide resin, etc.

A second anode connection electrode ANDE2 is disposed on the first planarization layer 160. The second anode connection electrode ANDE2 is connected to the first anode connection electrode ANDE1 through a second connection contact hole ANCT2 that penetrates through the first planarization layer 160. The second anode connection electrode ANDE2 has a single layer or multiple layers made of any one of molybdenum (Mo), aluminum (Al), chromium (Cr), gold (Au), titanium (Ti), nickel (Ni), neodymium (Nd), or copper (Cu), or alloys thereof.

A second planarization layer 180 is disposed on the second anode connection electrode ANDE2 and the first planarization layer 160. The second planarization layer 180 is an organic layer made of at least one of an acryl resin, an epoxy resin, a phenolic resin, a polyamide resin, or a polyimide resin, etc.

Light emitting elements LEL and a bank 190 are disposed on the second planarization layer 180. Each of the light emitting elements LEL includes a pixel electrode 171, a light emitting layer 172, and a common electrode 173.

The pixel electrode 171 is disposed on the second planarization layer 180. The pixel electrode 171 is connected to the second anode connection electrode ANDE2 through a third connection contact hole ANCT3 that penetrates through the second planarization layer 180.

In a top emission structure in which light is emitted from the light emitting layer 172 toward the common electrode 173, the pixel electrode 171 is formed of a highly reflective metal, such as a stacked structure (Ti/Al/Ti) of aluminum and titanium, a stacked structure (ITO/Al/ITO) of aluminum and indium tin oxide (ITO), an APC alloy, or a stacked structure (ITO/APC/ITO) of an APC alloy and ITO. The APC alloy is an alloy of silver (Ag), palladium (Pd), and copper (Cu).

The bank 190 partitions the pixel electrode 171 on the second planarization layer 180 to define the first to third light emitting areas EA1 to EA3. The bank 190 covers an edge of the pixel electrode 171. The bank 190 is an organic layer that includes at least one of an acrylic resin, an epoxy resin, a phenolic resin, a polyamide resin, or a polyimide resin.

Each of the first to third light emitting areas EA1 to EA3 refers to an area in which the pixel electrode 171, the light emitting layer 172, and the common electrode 173 are sequentially stacked and holes from the pixel electrode 171 and electrons from the common electrode 173 are combined with each other in the light emitting layer 172 to emit light.

The light emitting layer 172 may be disposed on the pixel electrode 171 and the bank 190. The light emitting layer 172 includes an organic material that emits light of a predetermined color. For example, the light emitting layer 172 includes a hole transporting layer, an organic material layer, and an electron transporting layer.

The common electrode 173 is disposed on the light emitting layer 172 and the bank 190. The common electrode 173 covers the light emitting layer 172. The common electrode 173 is commonly formed in the first light emitting area EA1, the second light emitting area EA2, and the third light emitting area EA3. A capping layer is formed on the common electrode 173.

In the top emission structure, the common electrode 173 is formed of a transparent conductive material (TCO) such as ITO or indium zinc oxide (IZO) that can transmit light therethrough, or a semi-transmissive conductive material such as magnesium (Mg), silver (Ag), or an alloy of magnesium (Mg) and silver (Ag). When the common electrode 173 is formed of a semi-transmissive conductive material, emission efficiency is increased by a micro cavity.

An encapsulation layer TFEL is disposed on the common electrode 173. The encapsulation layer TFEL includes at least one inorganic layer that prevents oxygen or moisture from penetrating into the light emitting element layer EML. In addition, the encapsulation layer TFEL includes at least one organic layer that protects the light emitting element layer EML from foreign materials such as dust. For example, the encapsulation layer TFEL includes a first inorganic encapsulation layer TFE1, an organic encapsulation layer TFE2, and a second inorganic encapsulation layer TFE3.

The first inorganic encapsulation inorganic layer TFE1 may be disposed on the common electrode 173, the organic encapsulation layer TFE2 is disposed on the first inorganic encapsulation layer TFE1, and the second inorganic encapsulation inorganic layer TFE3 is disposed on the organic encapsulation layer TFE2. The first inorganic encapsulation layer TFE1 and the second inorganic encapsulation layer TFE3 include multiple layers in which one or more inorganic layers of a silicon nitride layer, a silicon oxynitride layer, a silicon oxide layer, a titanium oxide layer, or an aluminum oxide layer are alternately stacked. The organic encapsulation layer TFE2 is an organic layer that includes at least one of an acrylic resin, an epoxy resin, a phenolic resin, a polyamide resin, or a polyimide resin.

A touch sensing unit TSU is disposed on the encapsulation layer TFEL. The touch sensing unit TSU includes a first touch insulating layer TINS1, the connection electrode CE, a second touch insulating layer TINS2, the driving electrode TE, the sensing electrode RE, and a third touch insulating layer TINS3.

The first touch insulating layer TINS1 is an inorganic layer, such as at least one of a silicon nitride layer, a silicon oxynitride layer, a silicon oxide layer, a titanium oxide layer, or an aluminum oxide layer.

The connection electrode CE is disposed on the first touch insulating layer TINS1. The connection electrode CE includes a single layer or multiple layers made of any one of molybdenum (Mo), aluminum (Al), chromium (Cr), gold (Au), titanium (Ti), nickel (Ni), neodymium (Nd), or copper (Cu), or alloys thereof.

When the connection electrodes CE are formed, the reflective electrodes CR that form code patterns are simultaneously formed of the same metal as the connection electrodes CE. For example, the connection electrodes CE and the reflective electrodes CR are formed of the same metal on the same layer in the same process. The connection electrodes CE and the reflective electrodes CR are formed on the same process layer in the same process, such as a patterning process, but are physically and electrically separated from each other. Accordingly, the reflective electrodes CR are maintained in a floating state unlike the connection electrodes CE.

A second touch insulating layer TINS2 is disposed on the first touch insulating layer TINS1, the connection electrodes CE and the reflective electrodes CR. The second touch insulating layer TINS2 is an inorganic layer, such as at least one of a silicon nitride layer, a silicon oxynitride layer, a silicon oxide layer, a titanium oxide layer, or an aluminum oxide layer. In an embodiment, the second touch insulating layer TINS2 is an organic layer such as an acryl resin, an epoxy resin, a phenolic resin, a polyamide resin, or a polyimide resin, etc.

The driving electrodes TE and the sensing electrodes RE are disposed on the second touch insulating layer TINS2. In addition, the dummy electrodes DE, first touch driving lines TL1, second touch driving lines TL2, and touch sensing lines RL illustrated in FIG. 9 are disposed on the second touch insulating layer TINS2.

The driving electrodes TE, the sensing electrodes RE, and the dummy electrodes DE are formed as a conductive metal, and the conductive metal is any one of molybdenum (Mo), aluminum (Al), chromium (Cr), gold (Au), titanium (Ti), nickel (Ni), neodymium (Nd), or copper (Cu), or alloys thereof. The driving electrodes TE, the sensing electrodes RE, and the dummy electrodes DE have a mesh structure or a net structure that does not overlap the light emitting areas EA1, EA2, and EA3. Each of the driving electrode TE and the sensing electrode RE partially overlaps the connection electrode CE in the third direction (Z-axis direction). The driving electrode TE is connected to the connection electrode CE through a touch contact hole TCNT1 that penetrates through the second touch insulating layer TINS2.

A plurality of light blocking members CP are formed in a preset planar code shape on some areas of the front surfaces of the driving electrodes TE, the sensing electrodes RE, and the dummy electrodes DE. Each of the light blocking members CP include materials that absorb infrared or ultraviolet light. For example, the light blocking member CP includes an inorganic or organic black pigment. The inorganic black pigment includes at least one of carbon black, cyanine, polymethine, anthraquinone, or phthalocyanine-based compounds. In an embodiment, the organic black pigment includes at least one of lactam black, perylene black, or aniline black, but is not necessarily limited thereto.

When infrared light from the touch input device 20 is incident to the touch sensing unit TSU, each of the light blocking members CP formed in the planar code shape can be distinguished from other adjacent electrodes, such as adjacent electrodes that are not covered by the light blocking member CP. Since the code pattern formed by the light blocking members CP is detected by the touch input device 20 that recognizes infrared or ultraviolet light, the image quality of the display device 10 is not affected.

As described above, the reflective electrode CR is positioned on the rear surface of the process layer on which the light blocking member CP is formed, and has at least some areas that overlap the rear surface of the light blocking member CP according to the size and the planar code shape of the light blocking member CP. In particular, a width CRw of the reflective electrode CR in at least one of the first to fourth directions DR1 to DR4 and upper, lower, left, or right directions is greater than a width CPw of the light blocking member CP. Therefore, as illustrated in FIGS. 8 and 9, the reflective electrode CR protrudes from an outer circumferential surface of the light blocking member CP in at least one of the first to fourth directions DR1 to DR4 and the upper, lower, left, or right directions of the outer circumferential surfaces in a plan view, and surrounds the outer circumferential surface of the light blocking member CP in at least one of the first to fourth directions DR1 to DR4 and the upper, lower, left, or right directions of the outer circumferential surfaces. In addition, the reflective electrode CR protrudes from an inner circumferential surface of the light blocking member CP in at least one of the first to fourth directions DR1 to DR4 of the inner circumferential surfaces in a plan view, and surrounds the inner circumferential surface of the light blocking member CP in at least one of the first to fourth directions DR1 to DR4 of the inner circumferential surfaces.

A third touch insulating layer TINS3 is formed on each of the driving electrodes TE, the sensing electrodes RE, and the plurality of light blocking members CP. The third touch insulating layer TINS3 planarizes steps formed by the driving electrodes TE, the sensing electrodes RE, and the connection electrodes CE. The third touch insulating layer TINS3 is formed of an inorganic layer, such as one of a silicon nitride layer, a silicon oxynitride layer, a silicon oxide layer, a titanium oxide layer, or an aluminum oxide layer. In an embodiment, the third touch insulating layer TINS3 is also formed of an organic layer, such as one of an acryl resin, an epoxy resin, a phenolic resin, a polyamide resin, or a polyimide resin, etc.

A color filter layer CFL is formed on the touch sensing unit TSU. The color filter layer CFL includes a plurality of first to third color filters CFL1, CFL2, and CFL3 disposed in a planar shape on the third touch insulating layer TINS3.

The color filter layer CFL is formed on the third touch insulating layer TINS3 and overlaps the first to third light emitting areas EA1 to EA3, respectively, but may also be formed on the second touch insulating layer TINS2, the driving electrodes TE and the sensing electrodes RE, to overlap the first to third light emitting areas EA1 to EA3, respectively.

The first color filter CFL1 is disposed on the first light emitting area EA1 that emits light of a first color, the second color filter CFL2 is disposed on the second light emitting area EA2 that emits light of a second color, and the third color filter CFL3 is disposed on the third light emitting area EA3 that emits light of a third color. In addition, the second color filter CFL2 may also be disposed on the fourth light emitting area EA4 that emits light of a fourth color.

Figure 10:
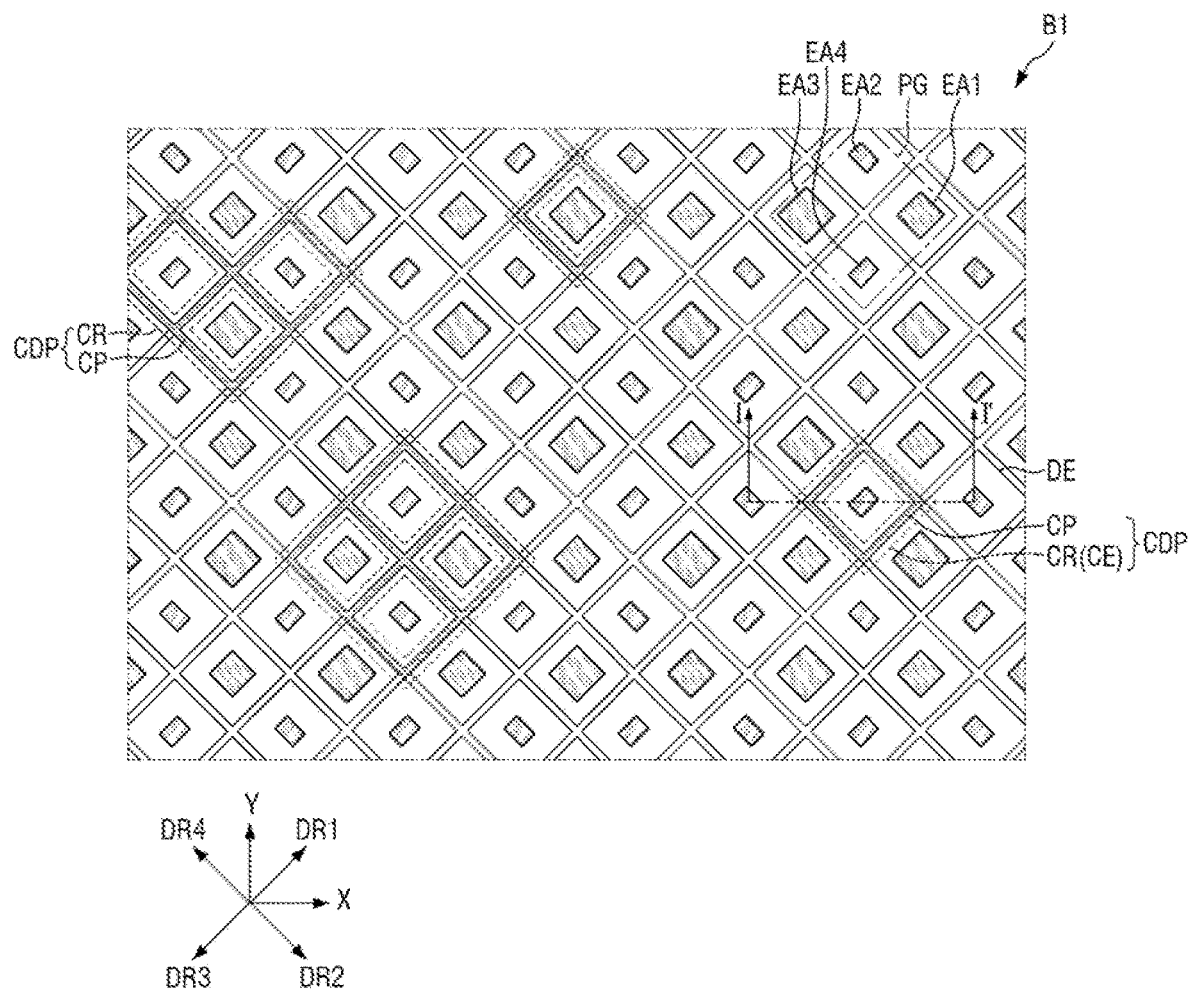
FIG. 10 is an enlarged view of area B1 in FIG. 6.

FIG. 10 is an enlarged view of area B1 in FIG. 6.

Referring to FIG. 10, in an embodiment, the light blocking members CP that form the code pattern CDP are formed by covering some areas of the front surfaces of the dummy electrodes DE with the planar code shape that has a preset size.

The reflective electrode CR is positioned on a rear surface of the process layer on which the light blocking member CP is formed, and has at least some areas that overlap the rear surface of the light blocking member CP. For example, the reflective electrode CR protrudes from all of the outer circumferential surfaces of the light blocking member CP in the first to fourth directions DR1 to DR4 and upper, lower, left, or right directions in a plan view, and surrounds all of the outer circumferential surfaces of the light blocking member CP in the first to fourth directions DR1 to DR4. In addition, the reflective electrode CR protrude from all of the inner circumferential surfaces of the light blocking member CP in the first to fourth directions DR1 to DR4, and surrounds all of the inner circumferential surfaces of the light blocking member CP in the first to fourth directions DR1 to DR4.

Figure 11:
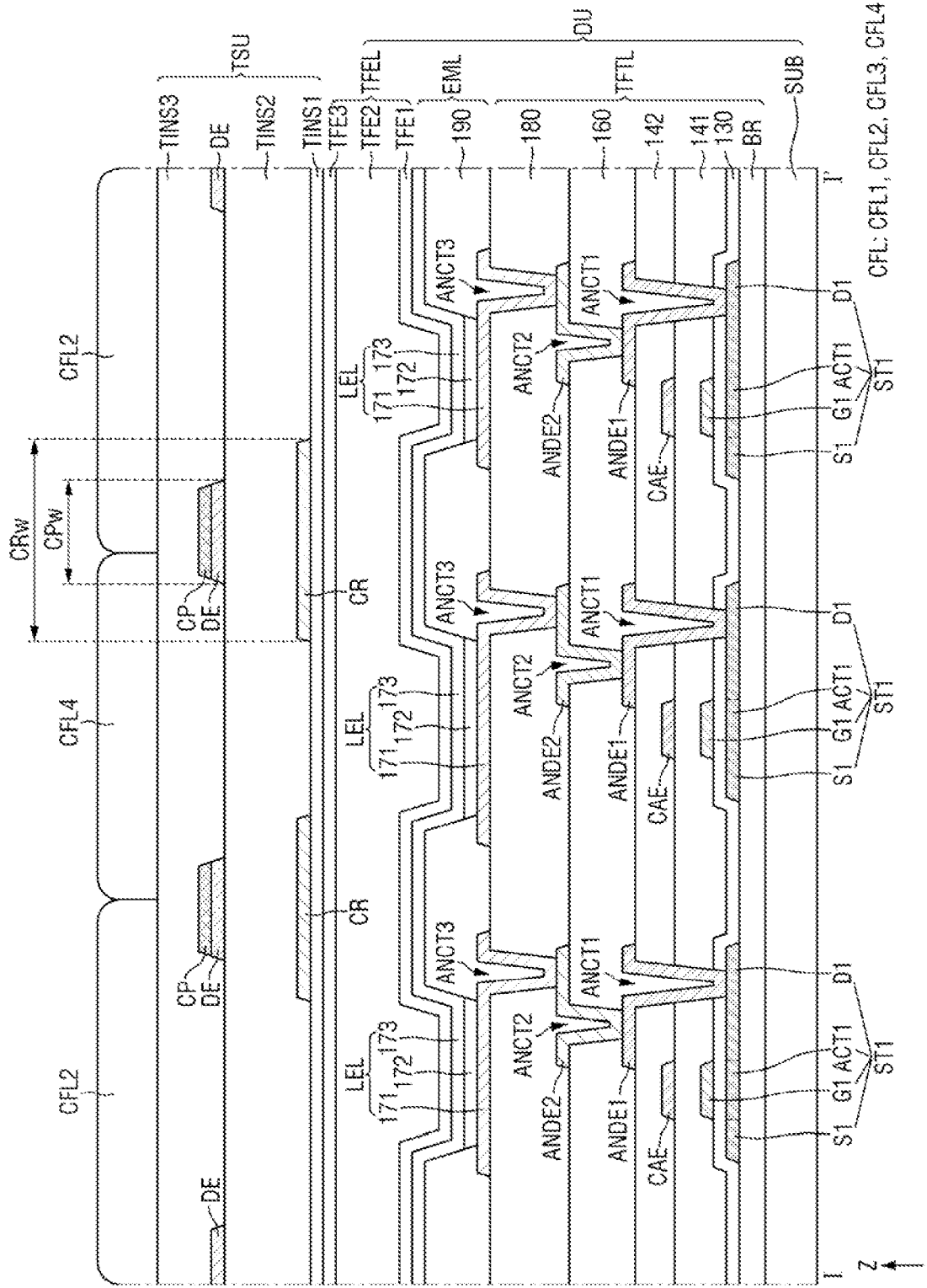
FIG. 11 is a cross-sectional view taken along line I-I' of FIG. 10.

FIG. 11 is a cross-sectional view taken along line I-I' of FIG. 10.

Referring to FIG. 11, in an embodiment, the reflective electrodes CR are patterned on the first touch insulating layer TINS1 in areas that overlap the dummy electrode DE, using the same metal as the connection electrode CE when the connection electrode CE is formed. The connection electrodes CE and the reflective electrodes CR are formed on the same layer through the same process, but are physically and electrically separated from each other. In addition, the second touch insulating layer TINS2 is disposed on the first touch insulating layer TINS1, the connection electrodes CE and the reflective electrodes CR.

The dummy electrodes DE are patterned and disposed on the second touch insulating layer TINS2. In addition, a plurality of light blocking members CP are formed in a preset planar code shape on some areas of the front surfaces of the dummy electrodes DE. In this case, each light blocking member CP includes an infrared or ultraviolet absorbing material. Accordingly, the reflective electrode CR is positioned on a rear layer (or a lower layer) of the layer on which the light blocking member CP is formed, and has at least some areas that overlapg the light blocking member CP on the rear surface of the light blocking member CP.

For example, a width CRw of the reflective electrode CR is greater than a width CPw of the light blocking member CP. Therefore, as illustrated in FIGS. 10 and 11, the reflective electrode CR protrudes from the outer circumferential surfaces of the light blocking member CP in the first to fourth directions DR1 to DR4 in a plan view, and surrounds the outer circumferential surfaces of the light blocking member CP in the first to fourth directions DR1 to DR4. In addition, the reflective electrode CR protrudes from the inner circumferential surfaces of the light blocking member CP in the first to fourth directions DR1 to DR4 in a plan view, and surrounds the inner circumferential surfaces of the light blocking member CP in the first to fourth directions DR1 to DR4. Therefore, when infrared light from the touch input device 20 is incident to the touch sensing unit TSU, the plurality of light blocking members CP in the planar code shape can be distinguished from other electrodes that are not covered by the light blocking member CP. In particular, as described above, because the reflective electrode CR more widely protruding from the outer circumferential side direction and the inner circumferential side direction of the light blocking member CP in a plan view, light is reflected from the front surface of the reflective electrode CR, a difference between an amount of light reflected from the light blocking member CP and an amount of light reflected from the reflective electrode CR is increased. Accordingly, identification sensitivity of the touch input device 20 for the light blocking member CP is increased, and a recognition rate of the light blocking member CP is increased.

Figure 12:
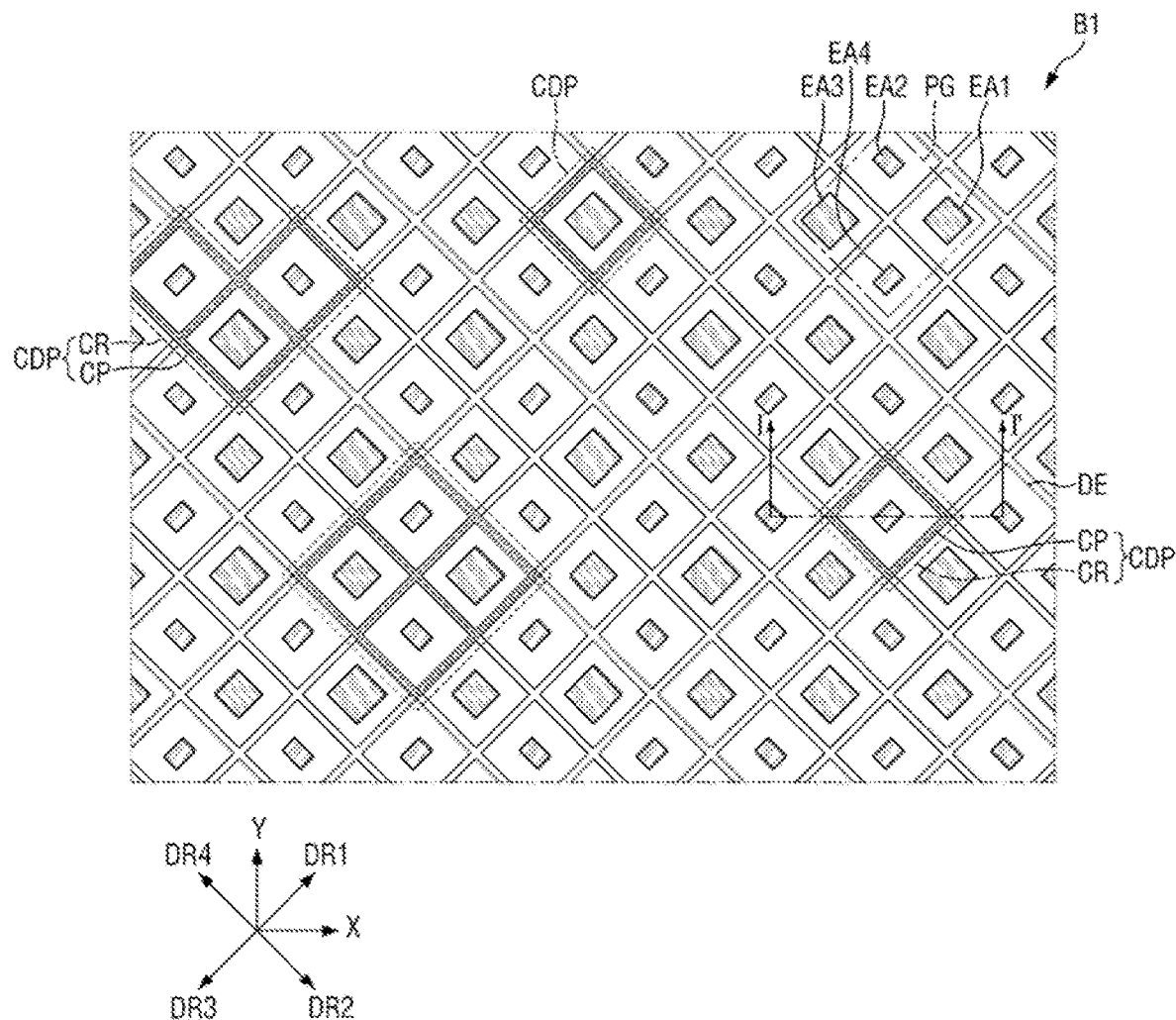
FIG. 12 is an enlarged view of a portion of an area B1 according to an embodiment.

FIG. 12 is an enlarged view of a code pattern unit and a portion of an area B1 according to an embodiment.

Referring to FIG. 12, in an embodiment, the light blocking members CP that form the code pattern CDP are formed by covering some areas of the front surfaces of the driving electrodes TE, the sensing electrodes RE, and the dummy electrodes DE with the preset planar code shape.

The reflective electrode CR is positioned on a rear surface of the process layer on which the light blocking member CP is formed, and has some areas that overlap the light blocking member CP according to the size and the planar code shape of the light blocking member CP. For example, as illustrated in FIG. 12, the reflective electrode CR protrudes in all directions from the outer circumferential surfaces of the light blocking member CP in plan view, and surrounds all of the outer circumferential surfaces of the light blocking member CP. In an embodiment, the reflective electrode CR protrudes from an outer circumferential surface of the light blocking member CP in at least one of the first to fourth directions DR1 to DR4 in a plan view, and surrounds the outer circumferential surface of the light blocking member CP in at least one direction.

Figure 13:
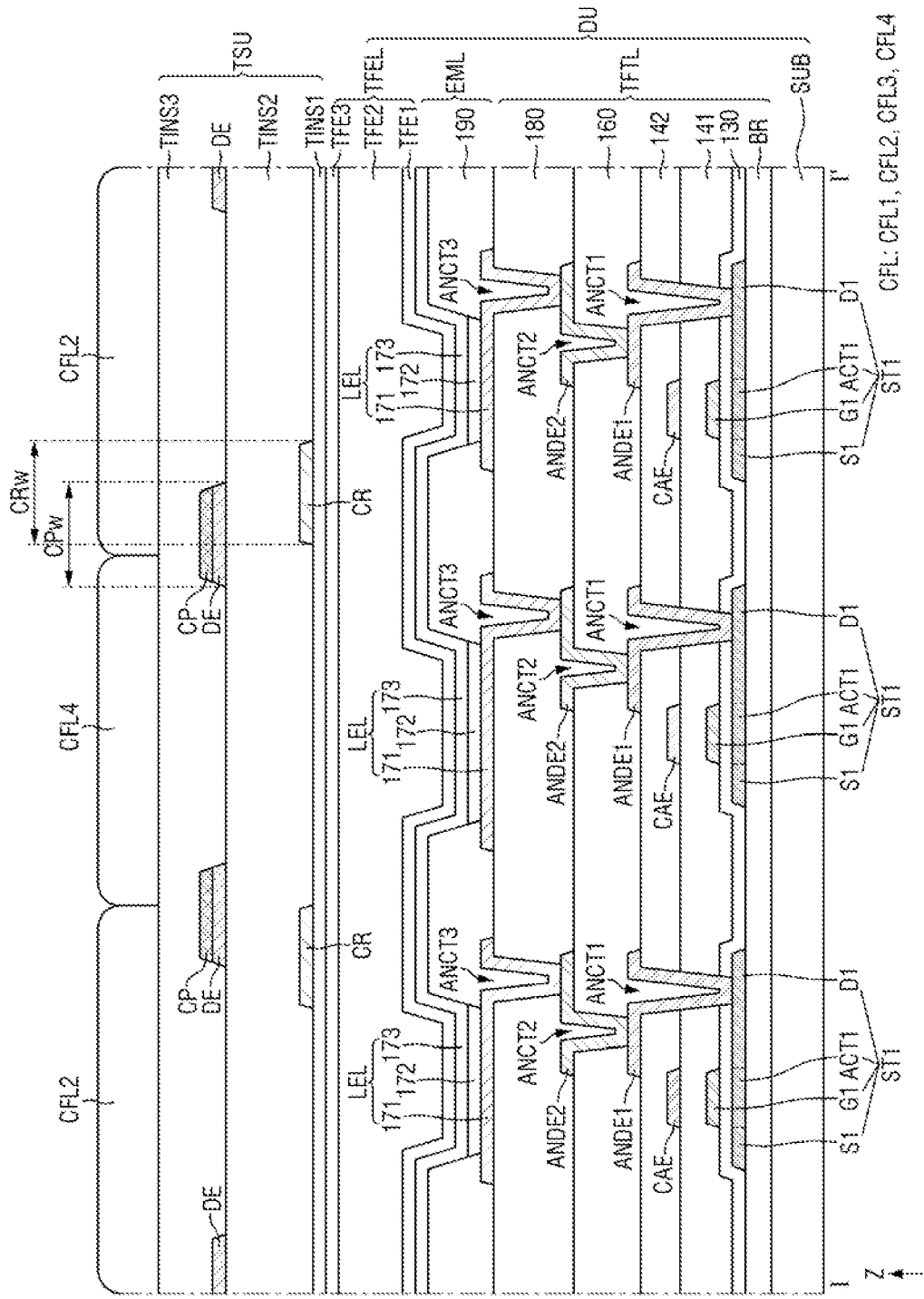
FIG. 13 is a cross-sectional view taken along line I-I' of FIG. 12.

FIG. 13 is a cross-sectional view taken along line I-I' of FIG. 12.

Referring to FIG. 13, in an embodiment, the reflective electrodes CR are formed by patterning the same metal as the connection electrode CE on the first touch insulating layer TINS1 that is disposed on the image display unit DU. The connection electrodes CE and the reflective electrodes CR are formed on the same layer through the same process, and are electrically separated from each other. Accordingly, the reflective electrodes CR are maintained in a floating state. In addition, the second touch insulating layer TINS2 is disposed on the first touch insulating layer TINS1, the connection electrodes CE and the reflective electrodes CR.

The driving electrodes TE, the sensing electrodes RE, and the dummy electrodes DE are disposed on the second touch insulating layer TINS2. In addition, a plurality of light blocking members CP are formed in a preset planar code shape on some areas of the front surfaces of the driving electrodes TE, the sensing electrodes RE, and the dummy electrodes DE. Accordingly, the reflective electrode CR are positioned on a rear of the layer on which the light blocking member CP is formed, and has at least some areas that overlap the light blocking member CP according to the size and the planar code shape of the light blocking member CP. For example, the reflective electrode CR partially overlaps the light blocking member CP, but does not completely overlap the light blocking member CP.

For example, a width CRw of the reflective electrode CR in at least one direction is the same as a width CPw of the light blocking member CP, and the reflective electrode CR protrudes from the outer circumferential surfaces of the light blocking member CP in the first to fourth directions DR1 to DR4 in a plan view, and surrounds all of the outer circumferential surfaces of the light blocking member CP. In addition, the width CRw of the reflective electrode CR is greater than the width CPw of the light blocking member CP in at least one direction, and the reflective electrode CR protrudes from the outer circumferential surface of the light blocking member CP in at least one of the first to fourth directions DR1 to DR4 in a plan view, and surrounds the outer circumferential surface of the light blocking member CP in at least one direction. However, the reflective electrode CR does not protrudes from the inner circumferential surface of the light blocking member CP in at least one of the first to fourth directions DR1 to DR4 in a plan view, and does not surround the inner circumferential surface of the light blocking member CP in at least one direction. For example, the light blocking member CP protrudes from the inner circumferential surface of the reflective electrode CR in at least one of the first to fourth directions DR1 to DR4 in a plan view, and surrounds the inner circumferential surface of the reflective electrode CR in at least one direction.

Figure 14:
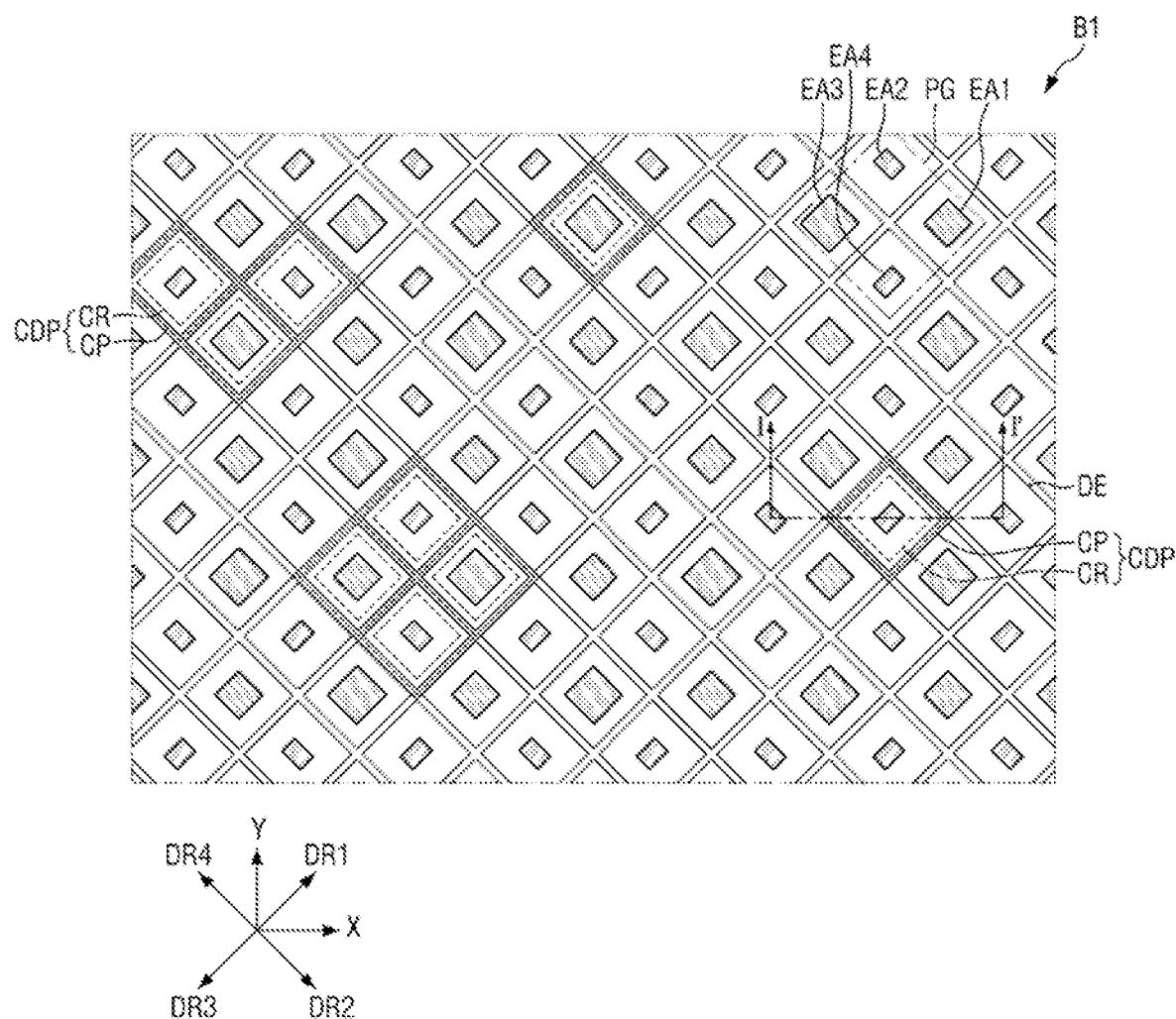
FIG. 14 is an enlarged view of a portion of an area B1 according to an embodiment.

FIG. 14 is an enlarged view of a portion of an area B1 according to an embodiment.

Referring to FIG. 14, in an embodiment, the light blocking members CP is formed by covering some areas of the front surfaces of the driving electrodes TE, the sensing electrodes RE, and the dummy electrodes DE with the preset planar code shape.

The reflective electrode CR is positioned on a rear of the layer on which the light blocking member CP is formed, and has some areas that overlap the light blocking member CP according to the planar shape of the light blocking member CP. For example, as illustrated in FIG. 14, the reflective electrode CR protrudes in all directions from the inner circumferential surfaces of the light blocking member CP in a plan view, and surrounds all of the inner circumferential surfaces of the light blocking member CP. Similarly, the light blocking member CP the reflective electrode CR protrudes in all directions from the outer circumferential surfaces of the reflective electrode CR in a plan view, and surrounds all of the outer circumferential surfaces of the reflective electrode CR. In an embodiment, the reflective electrode CR also protrudes from an inner circumferential surface of the light blocking member CP in at least one of the first to fourth directions DR1 to DR4 in a plan view, and surrounds the inner circumferential surface of the light blocking member CP in at least one direction.

Figure 15:
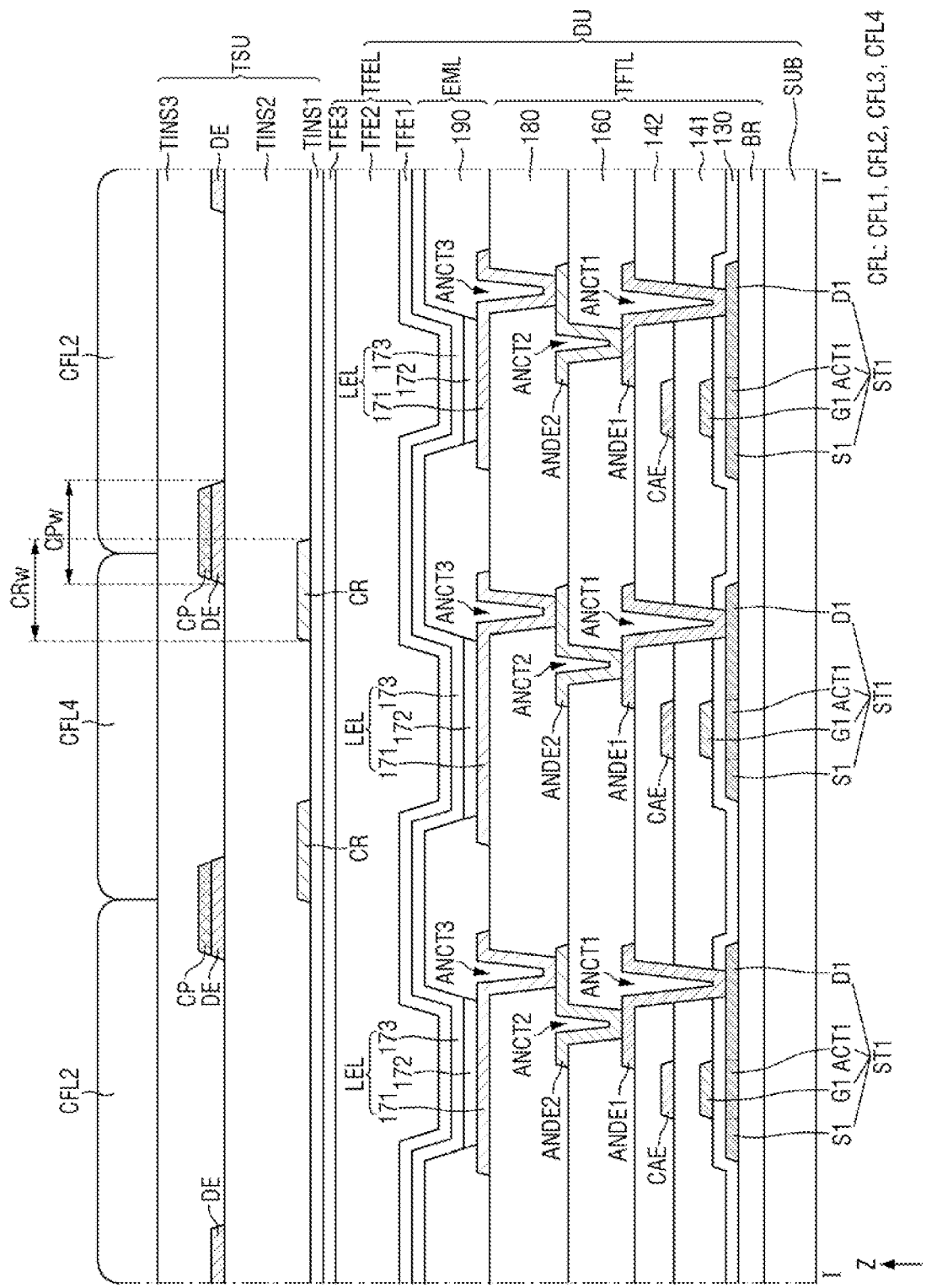
FIG. 15 is a cross-sectional view taken along line I-I' of FIG. 14.

FIG. 15 is a cross-sectional view s taken along line I-I' of FIG. 14.

Referring to FIG. 15, in an embodiment, the reflective electrodes CR are formed by patterning the same metal as the connection electrode CE on the first touch insulating layer TINS1. The connection electrodes CE and the reflective electrodes CR are electrically separated from each other, and the reflective electrodes CR are maintained in a floating state. A second touch insulating layer TINS2 is disposed on the first touch insulating layer TINS1, the connection electrodes CE and the reflective electrodes CR.

The driving electrodes TE, the sensing electrodes RE, and the dummy electrodes DE are disposed on the second touch insulating layer TINS2. In addition, a plurality of light blocking members CP are formed in a planar code shape on some of the front surfaces of the driving electrodes TE, the sensing electrodes RE, and the dummy electrodes DE. Accordingly, each of the reflective electrodes CR is positioned on a rear of the layer on which the light blocking member CP is formed, and have at least some areas that overlap the light blocking member CP.

For example, the width CRw of the reflective electrode CR is the same as the width CPw of the light blocking member CP, and the reflective electrode protrude in all directions from the inner circumferential surfaces of the light blocking member CP in a plan view, and surrounds all of the inner circumferential surfaces of the light blocking member CP. Similarly, the light blocking member CP the reflective electrode CR protrudes in all directions from the outer circumferential surfaces of the reflective electrode CR in a plan view, and surrounds all of the outer circumferential surfaces of the reflective electrode CR. In addition, the width CRw of the reflective electrode CR in at least one direction is greater than the width CPw of the light blocking member CP, and the reflective electrode CR protrudes from the inner circumferential surface of the light blocking member CP in at least one of the first to fourth directions DR1 to DR4 in a plan view, and surrounds the inner circumferential surface of the light blocking member CP in at least one direction.

Figure 16:
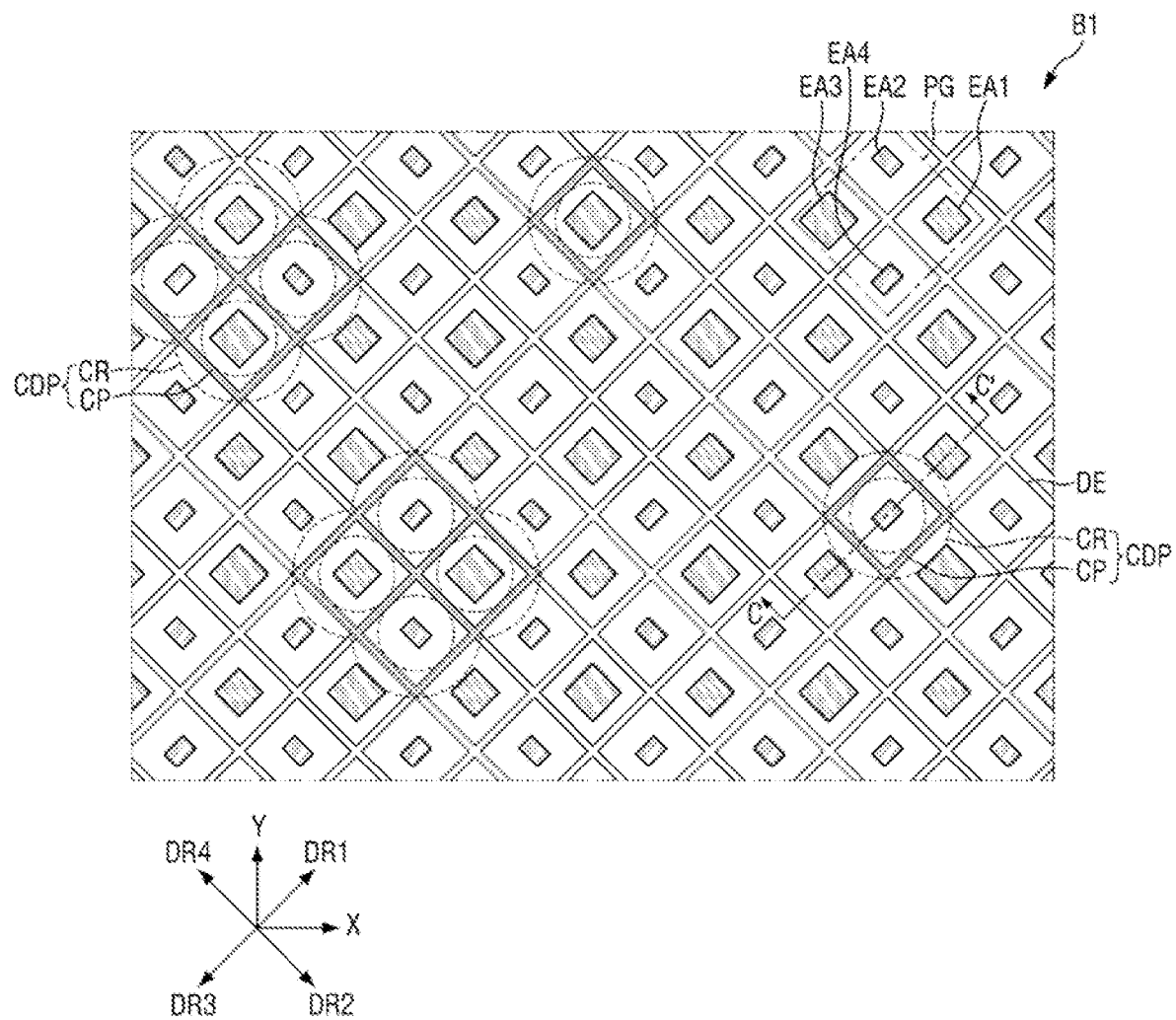
FIG. 16 is an enlarged view s of an area B1 according to an embodiment.

FIG. 16 is an enlarged view of a portion of an area B1 according to an embodiment.

Referring to FIG. 16, in an embodiment, the light blocking members CP are formed by covering some areas of the front surfaces of the driving electrodes TE, the sensing electrodes RE, and the dummy electrodes DE with the preset planar code shape.

The reflective electrode CR is positioned on a rear of the layer on which the light blocking member CP is formed, and has some areas that overlap the light blocking member CP according to the planar shape of the light blocking member CP. In addition, the reflective electrode CR has a curved shape that protrudes in all directions from the outer circumferential surfaces of the light blocking member CP in a plan view, and surrounds all of the outer circumferential surfaces of the light blocking member CP with a semicircular shape or a convex curve shape in a plan view. Alternatively, the reflective electrode CR has a curved shape that protrudes in at least one of the first to fourth directions DR1 to DR4 from an outer circumferential surface of the light blocking member CP in a plan view, and surrounds the outer circumferential surface of the light blocking member CP in at least one direction with a semicircular shape or a convex curved shape.

In addition, the reflective electrode CR partially concavely protrudes in all directions from the inner circumferential surfaces of the light blocking member CP in a plan view, and surrounds corners of the inner circumferential surfaces of the light blocking member CP. For example, the inner circumferential surface of the reflective electrode CR has a circular shape or an elliptical shape. The circular or elliptical inner circumferential surface of the reflective electrode CR further protrudes in the direction of the inner circumferential surface of the light blocking member CP.

The reflective electrode CR also has a curved shape that protrudes in at least one of the first to fourth directions DR1 to DR4 from an inner circumferential surface of the light blocking member CP in a plan view, and surrounds the inner circumferential surface of the light blocking member CP in at least one direction with a semicircular shape or a convex curved shape.

Figure 17:
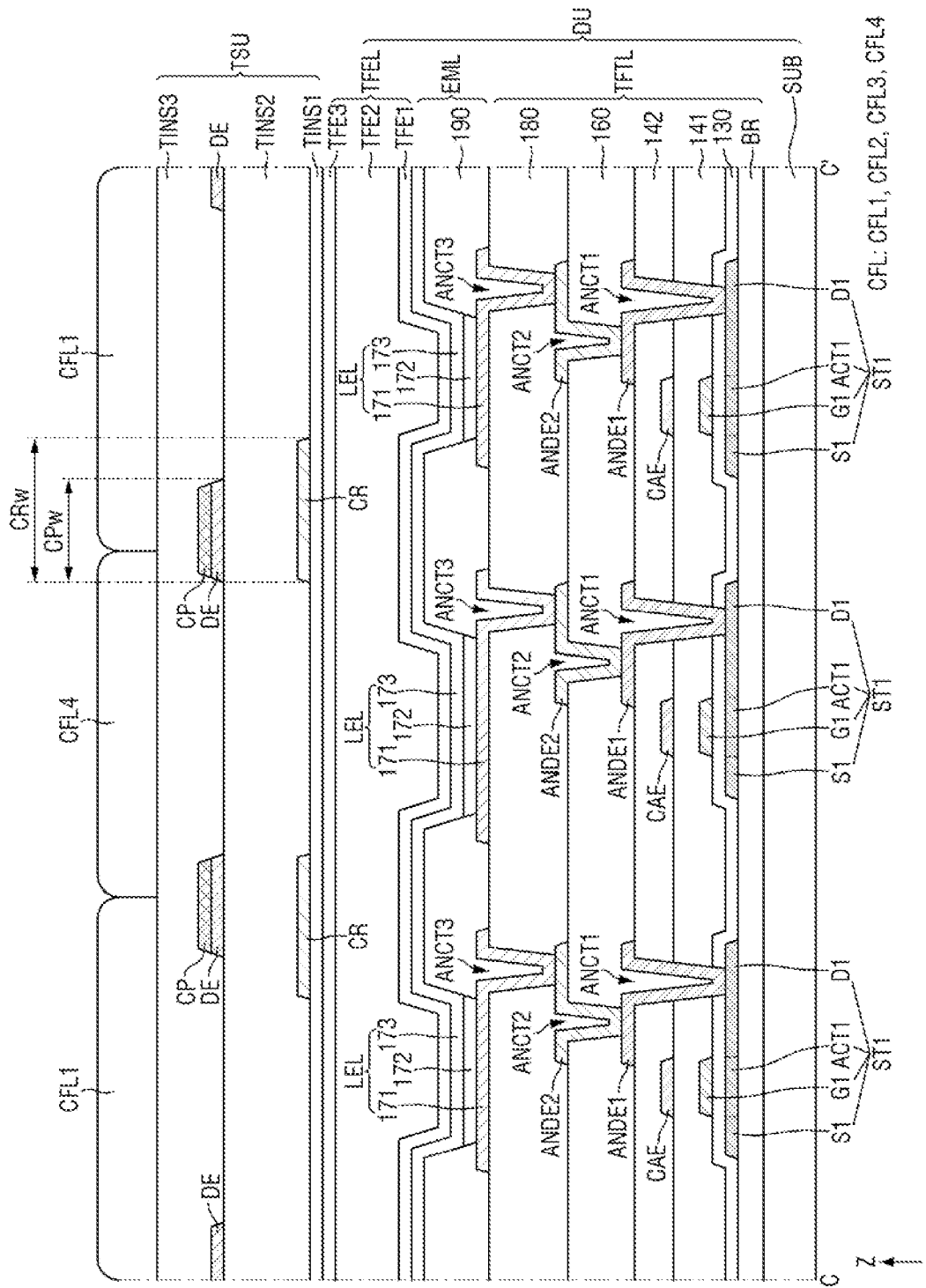
FIG. 17 is a cross-sectional view taken along line C-C' of FIG. 16.

FIG. 17 is a cross-sectional view taken along line C-C' of FIG. 16.

Referring to FIG. 17, in an embodiment, the reflective electrodes CR are formed by patterning the same metal as the connection electrode CE on the first touch insulating layer TINS1. A second touch insulating layer TINS2 is disposed on the first touch insulating layer TINS1, the connection electrodes CE and the reflective electrodes CR.

The driving electrodes TE, the sensing electrodes RE, and the dummy electrodes DE are disposed on the second touch insulating layer TINS2. In addition, a plurality of light blocking members CP are formed in a planar code shape on some areas of the front surfaces of the driving electrodes TE, the sensing electrodes RE, and the dummy electrodes DE. Accordingly, each of the reflective electrodes CR is positioned on a rear of the layer on which the light blocking member CP is formed, and has at least some areas that overlap the light blocking member CP.

For example, the reflective electrodes CR have a convex shape or a semicircular shape in a plan view, and the width CRw of the reflective electrodes CR is greater than the width CPw of the light blocking member CP, so that the reflective electrodes CR have the convex shape or the semicircular shape in a plan view. The reflective electrodes CR, which have a convex shape or a semicircular shape in a plan view, have a curved shape that protrudes in at least one of the first to fourth directions DR1 to DR4 from an outer circumferential surface of the light blocking member CP in plan view, and surround the outer circumferential surface of the light blocking member CP in at least one direction with a semicircular shape or a convex curved shape.

Figure 18:
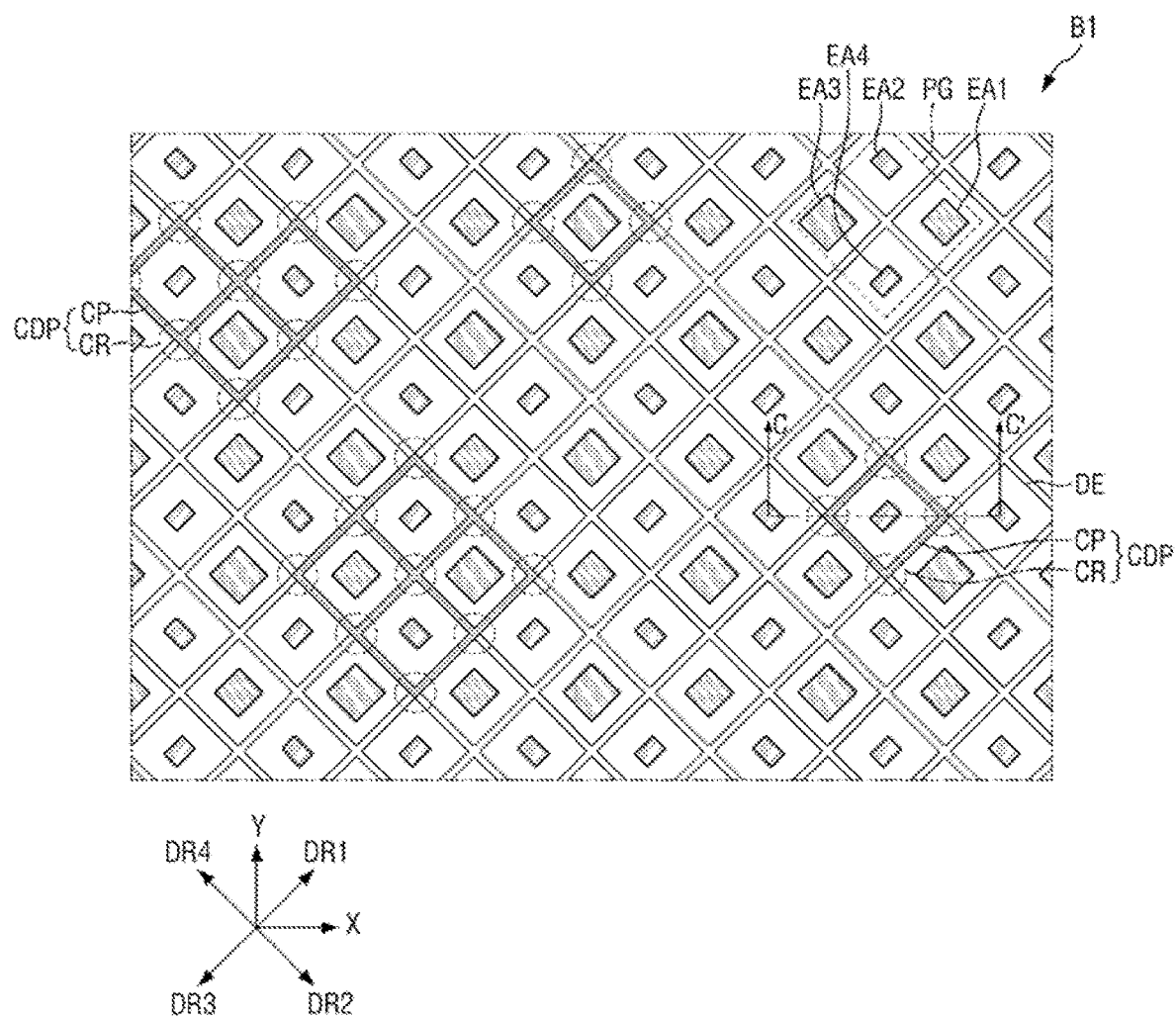
FIG. 18 is an enlarged view of an area B1 according to an embodiment.

FIG. 18 is an enlarged view of an area B1 according to an embodiment.

Referring to FIG. 18, the light blocking members CP are formed by covering some areas of the front surfaces of the driving electrodes TE, the sensing electrodes RE, and the dummy electrodes DE with the preset planar code shape.

The reflective electrode CR are positioned on a rear of the layer on which the light blocking member CP is formed, and has some areas that overlap the light blocking member CP according to the planar shape of the light blocking member CP. In addition, the reflective electrode CR has a circular or polygonal shape. Accordingly, the reflective electrode CR has a circular or polygonal shape that protrudes in a direction from an outer circumferential surface of each corner of the light blocking member CP in a plan view, and the circular or polygonal shape surrounds the outer circumferential surface of each corner of the light blocking member CP in a plan view. In an embodiment, the reflective electrode CR also has a circular or polygonal shape that protrudes from at least one of the upper, lower, left, or right corner directions of an outer circumferential surface of a corner of the light blocking member CP in a plan view, and the circular or polygonal shape surrounds the outer circumferential surface of the corner of the light blocking member CP in at least one direction. The reflective electrode CR surrounds an inner circumferential surface of the corner of the light blocking member CP in at least one direction with a sectoral-circular shape.

Figure 19:
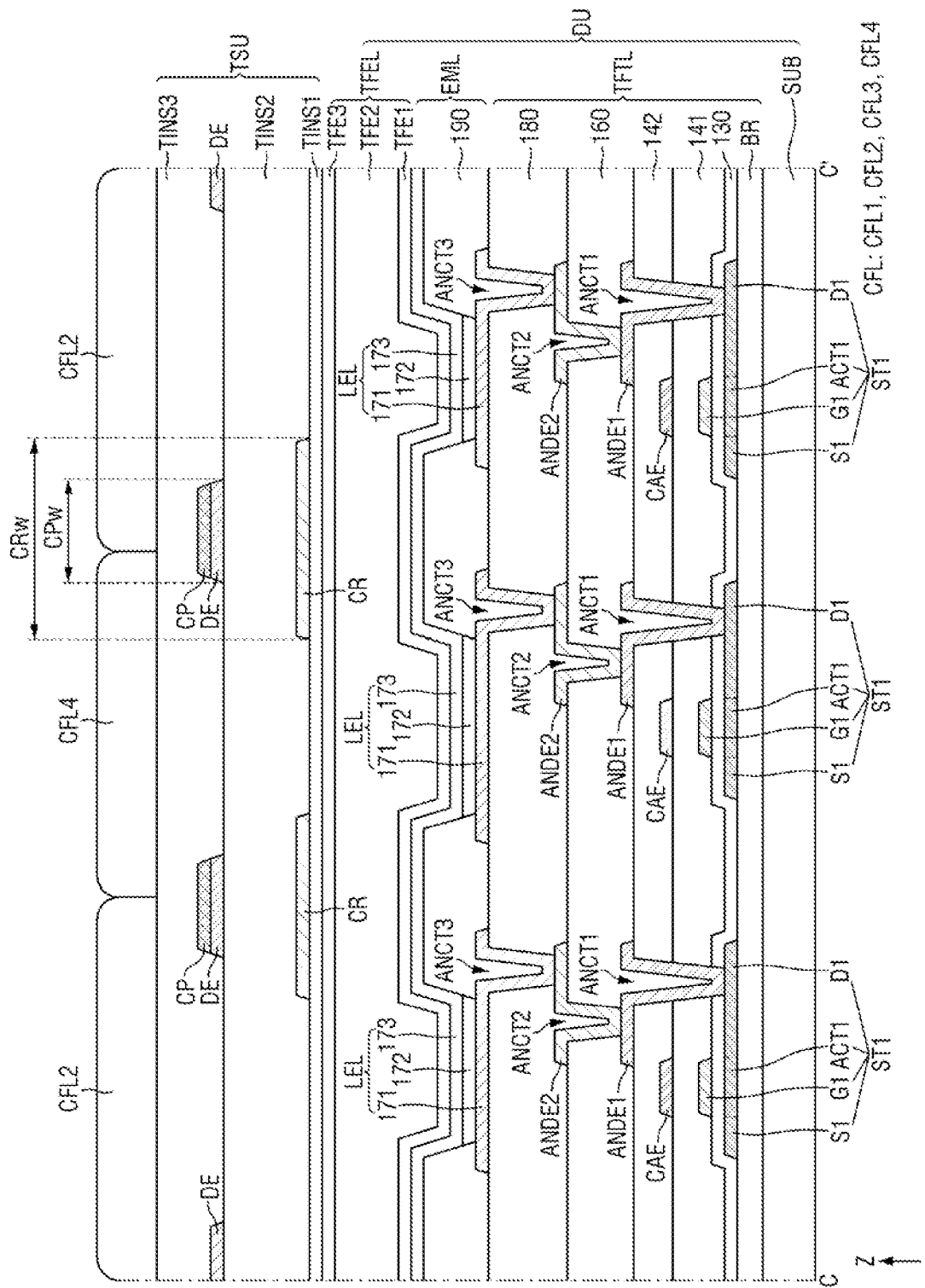
FIG. 19 is a cross-sectional view taken along line C-C' of FIG. 18.

FIG. 19 is a cross-sectional view taken along line C-C' of FIG. 18.

Referring to FIG. 19, the reflective electrodes CR are formed by patterning the same metal as the connection electrode CE on the first touch insulating layer TINS1. A second touch insulating layer TINS2 is disposed on the first touch insulating layer TINS1, the connection electrodes CE and the reflective electrodes CR.

The driving electrodes TE, the sensing electrodes RE, and the dummy electrodes DE are disposed on the second touch insulating layer TINS2. In addition, a plurality of light blocking members CP are formed in a planar code shape on some areas of the front surfaces of the driving electrodes TE, the sensing electrodes RE, and the dummy electrodes DE. Accordingly, each of the reflective electrodes CR is positioned on a rear of the layer on which the light blocking member CP is formed, and has at least some areas that overlap the light blocking member CP.

The reflective electrodes CR has a circular or polygonal shape in a plan view, and the width CRw of the reflective electrodes CR is greater than the width CPw of the light blocking member CP, so that the reflective electrodes CR have the circular or polygonal shape in a plan view. The circular or polygonal shaped reflective electrodes CR protrude in the upper, lower, left, and right directions from the outer circumferential surfaces and the inner circumferential surfaces of the corners of the light blocking member CP in a plan view, and the circular or polygonal shape surrounds an outer circumferential surface and an inner circumferential surface of the corner of the light blocking member CP in at least one direction.

Figure 20:
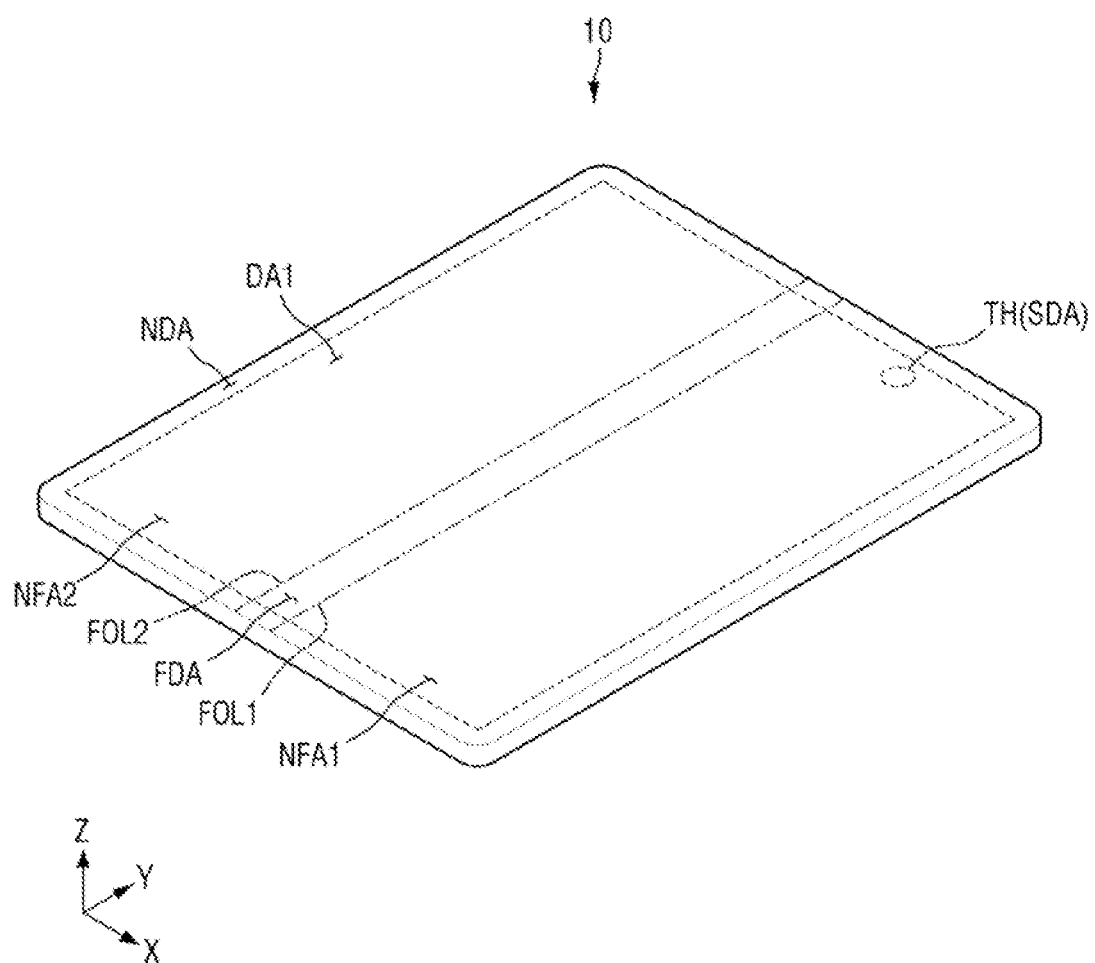
FIGS. 20 and 21 are perspective views of a display device according to an embodiment of the present disclosure.
Figure 21:
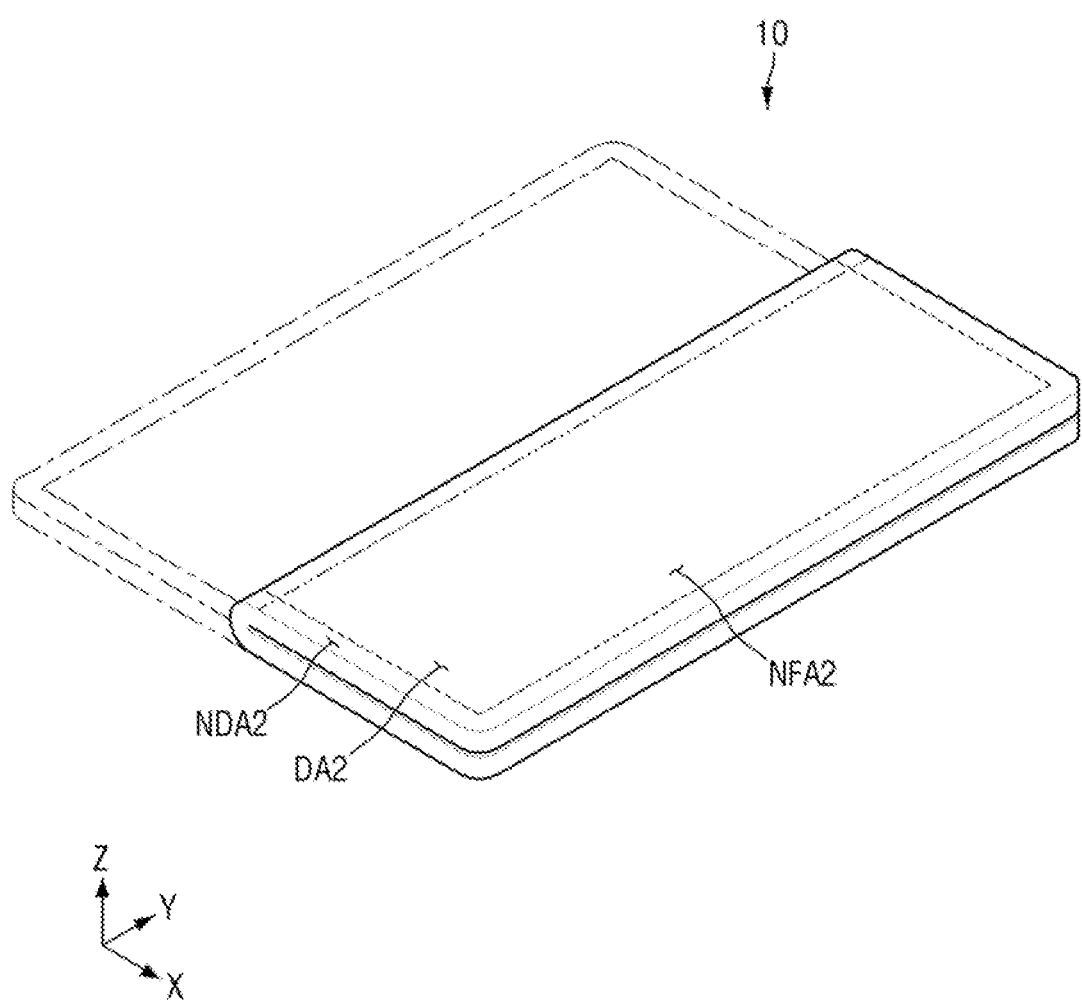

FIGS. 20 and 21 are perspective views of a display device according to an embodiment of the present disclosure.

FIGS. 20 and 21 illustrate a foldable display device 10 that is folded in the first direction (X-axis direction). The display device 10 can maintain both a folded state and an unfolded state. The display device 10 can be folded in an in-folding manner in which a front surface thereof is disposed inside. When the display device 10 is bent or folded in an in-folding manner, the front surfaces of the display device 10 face each other. Alternatively, the display device 10 can be folded in an out-folding manner in which the front surface thereof faces outward. When the display device 10 is bent or folded in an out-folding manner, the rear surfaces of the display device 10 face each other.

The display device 10 includes a folding area FDA, a first non-folding area NFA1, and a second non-folding area NFA2. The folding area FDA is where the display device 10 is folded, and the first non-folding area NFA1 and the second non-folding area NFA2 are areas of the display device 10 that are not folded. The first non-folding area NFA1 is disposed on one side, such as a right side of the folding area FDA. The second non-folding area NFA2 is disposed on the other side, such as a left side of the folding area FDA. The touch sensing unit TSU according to an embodiment of the present specification is disposed on the first non-folding area NFA1 and the second non-folding area NFA2, respectively.

A first folding line FOL1 and a second folding line FOL2 extend in the second direction (Y-axis direction), and the display device 10 can be folded in the first direction (X-axis direction) about the first folding line FOL1 and the second folding line FOL2. The first folding line FOL1 is a boundary between the folding area FDA and the first non-folding area NFA1, and the second folding line FOL2 is a boundary between the folding area FDA and the second non-folding area NFA2. Accordingly, since a length of the display device 10 in the first direction (X-axis direction) is reduced by about half, it may be more convenient for the user to carry the display device 10.

However, the extension direction of the first folding line FOL1 and the extension direction of the second folding line FOL2 are not limited to the second direction (Y-axis direction). For example, in an embodiment, the first folding line FOL1 and the second folding line FOL2 extend in a diagonal direction between the first direction (X-axis direction) and the second direction (Y-axis direction) of the display device 10. The display device 10 is folded in a triangular shape.

When the first folding line FOL1 and the second folding line FOL2 extend in the second direction (Y-axis direction), a length of the folding area FDA in the first direction (X-axis direction) is shorter than a length thereof in the second direction (Y-axis direction). In addition, a length of the first non-folding area NFA1 in the first direction (X-axis direction) is greater than the length of the folding area FDA in the first direction (X-axis direction). A length of the second non-folding area NFA2 in the first direction (X-axis direction) is greater than the length of the folding area FDA in the first direction (X-axis direction).

A first display area DA1 is disposed on the front surface of the display device 10. The first display area DA1 overlaps the folding area FDA, the first non-folding area NFA1, and the second non-folding area NFA2. Therefore, when the display device 10 is unfolded, an image is displayed in a front direction in the folding area FDA, the first non-folding area NFA1, and the second non-folding area NFA2 of the display device 10.

A second display area DA2 is disposed on the rear surface of the display device 10. The second display area DA2 overlaps the second non-folding area NFA2. Therefore, when the display device 10 is folded, an image is displayed in the front direction in the second non-folding area NFA2 of the display device 10.

FIGS. 20 and 21 illustrate a through hole TH in which a camera SDA is formed disposed in the first non-folding area NFA1, but embodiments of the present disclosure are not necessarily limited thereto. In embodiments, the through hole TH or the camera SDA may be disposed in the second non-folding area NFA2 or the folding area FDA.

Figure 22:
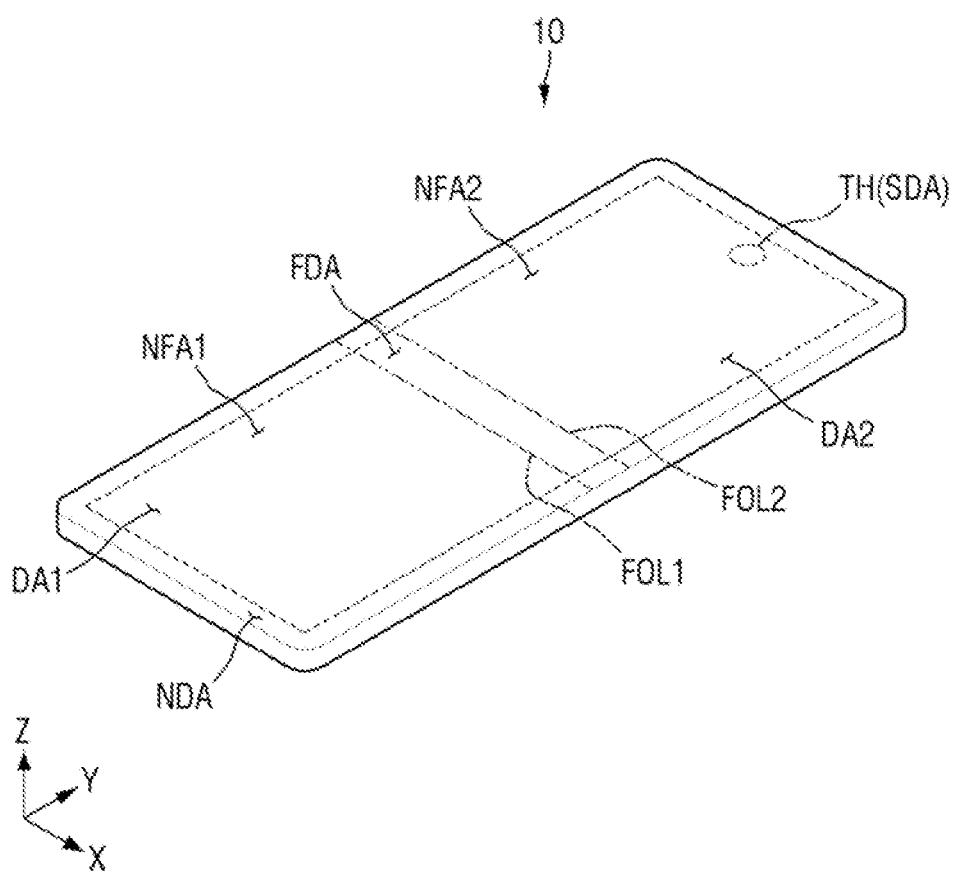
FIGS. 22 and 23 are perspective views of a display device according to an embodiment of the present disclosure.
Figure 23:
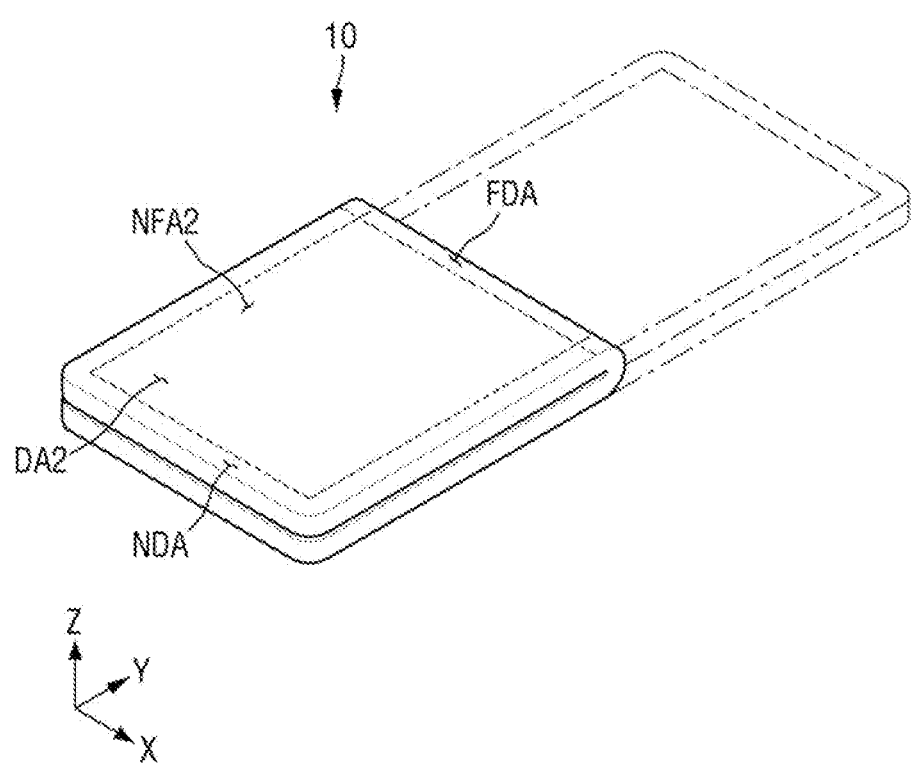

FIGS. 22 and 23 are perspective views of a display device according to an embodiment of the present disclosure.

FIGS. 22 and 23 illustrate a foldable display device 10 that is folded in the second direction (Y-axis direction). The display device 10 can maintain both a folded state and an unfolded state. The display device 10 can be folded in an in-folding manner in which a front surface thereof is disposed inside. When the display device 10 is bent or folded in an in-folding manner, the front surfaces of the display device 10 face each other. Alternatively, the display device 10 can be folded in an out-folding manner in which the front surface thereof face outward. When the display device 10 is bent or folded in an out-folding manner, the rear surfaces of the display device 10 face each other.

The display device 10 includes a folding area FDA, a first non-folding area NFA1, and a second non-folding area NFA2. The folding area FDA is where the display device 10 is folded, and the first non-folding area NFA1 and the second non-folding area NFA2 are areas of the display device 10 that are not folded. The first non-folding area NFA1 is disposed on one side, such as a lower side of the folding area FDA. The second non-folding area NFA2 is disposed on the other side, such as an upper side of the folding area FDA.

The touch sensing unit TSU according to an embodiment of the present specification disposed on the first non-folding area NFA1 and the second non-folding area NFA2, respectively.

The display device 10 can be folded in the folding area FDA with a predetermined curvature at the first folding line FOL1 and the second folding line FOL2. Therefore, the first folding line FOL1 is a boundary between the folding area FDA and the first non-folding area NFA1, and the second folding line FOL2 is a boundary between the folding area FDA and the second non-folding area NFA2.

As illustrated in FIGS. 22 and 23, the first folding line FOL1 and the second folding line FOL2 extend in the first direction (X-axis direction), and the display device 10 can be folded in the second direction (Y-axis direction). Accordingly, since a length of the display device 10 in the second direction (Y-axis direction) is reduced by about half, it may be more convenient for the user to carry the display device 10.

However, the extending direction of the first folding line FOL1 and the extending direction of the second folding line FOL2 are not limited to the first direction (X-axis direction). For example, in embodiments, as disclosed above, the first folding line FOL1 and the second folding line FOL2 extend in a diagonal direction between the first direction (X-axis direction) and the second direction (Y-axis direction) of the display device 10. In this case, the display device 10 can be folded in a triangular shape.

When the first folding line FOL1 and the second folding line FOL2 extend in the first direction (X-axis direction) as illustrated in FIGS. 22 and 23, a length of the folding area FDA in the second direction (Y-axis direction) is shorter than a length thereof in the first direction (X-axis direction). In addition, a length of the first non-folding area NFA1 in the second direction (Y-axis direction) is greater than the length of the folding area FDA in the second direction (Y-axis direction). In addition, a length of the second non-folding area NFA2 in the second direction (Y-axis direction) is greater than the length of the folding area FDA in the second direction (Y-axis direction).

A first display area DA1 is disposed on the front surface of the display device 10. The first display area DA1 overlaps the folding area FDA, the first non-folding area NFA1, and the second non-folding area NFA2. Therefore, when the display device 10 is unfolded, an image can be displayed in a front direction in the folding area FDA, the first non-folding area NFA1, and the second non-folding area NFA2 of the display device 10.

A second display area DA2 is disposed on the rear surface of the display device 10. The second display area DA2 overlaps the second non-folding area NFA2. Therefore, when the display device 10 is folded, an image can be displayed in the front direction in the second non-folding area NFA2 of the display device 10.

FIGS. 22 and 23 illustrate a through hole TH in which a camera SDA is disposed formed in the second non-folding area NFA2, but embodiments of the present disclosure are not necessarily limited thereto. In embodiments, the through hole TH may be disposed in the first non-folding area NFA1 or the folding area FDA.

What is claimed is:

1. A display device, comprising:
   a display unit that includes a plurality of light emitting areas;
   a plurality of touch electrodes disposed between the plurality of light emitting areas and that sense a touch;
   a light blocking member that forms a code pattern by covering a portion of a front surface of at least one of the plurality of touch electrodes with a preset code shape; and
   a reflective electrode formed on a rear surface of the light blocking member and that has an area that at least partially overlaps the light blocking member and reflects light from a front surface of the reflective electrode,
   wherein the light blocking member covers a portion of the front surface and a portion of a side surface of the at least one touch electrode.

2. The display device of claim 1, wherein the code pattern has a planar shape of one of a closed loop of at least one of a rectangle, a square, a circle, or a rhombus, an open loop shape that partially surrounds at least one light emitting area of the plurality of light emitting areas, or a straight or curved shape of a preset length.

3. The display device of claim 1, wherein the light blocking member includes an inorganic or organic black pigment that absorbs infrared or ultraviolet light.

4. The display device of claim 1, wherein the reflective electrode and a connection electrode are formed from a same metal through a same process on a rear surface of a process layer, wherein the connection electrode electrically connects two touch electrodes of the plurality of touch electrodes, and
   the two touch electrodes of the plurality of touch electrodes are electrically connected to the connection electrode through a plurality of contact holes.

5. The display device of claim 4, wherein the reflective electrode protrudes from at least one of an outer circumferential surface or an inner circumferential surface of the light blocking member in a plan view, and surrounds at least one of the outer or inner circumferential surfaces of the light blocking member.

6. The display device of claim 4, wherein the reflective electrode protrudes from an outer circumferential surface of the light blocking member in at least one of first to fourth diagonal directions and upper, lower, left, or right directions of outer circumferential surfaces of the light blocking member in a plan view, and surrounds the outer circumferential surface of the light blocking member in at least one of the first to fourth diagonal directions and the upper, lower, left, or right directions of the outer circumferential surfaces of the light blocking member.

7. The display device of claim 4, wherein the reflective electrode protrudes from an inner circumferential surface of the light blocking member in at least one of first to fourth diagonal directions and upper, lower, left, or right directions of inner circumferential surfaces of the light blocking member in a plan view, and surrounds the inner circumferential surface of the light blocking member in at least one of the first to fourth diagonal directions and the upper, lower, left, or right directions of the inner circumferential surfaces of the light blocking member.

8. The display device of claim 4, wherein the reflective electrode is electrically separated from the plurality of touch electrodes and the connection electrode and is maintained in a floating state.

9. The display device of claim 4, wherein the reflective electrode has a width in at least one of first to fourth diagonal directions and upper, lower, left, or right directions that is greater than a width of the light blocking member, and surrounds all of the inner and outer circumferential surfaces of the light blocking member in the first to fourth diagonal directions and the upper, lower, left, and right directions in a plan view.

10. The display device of claim 4, wherein the reflective electrode has a width in at least one of first to fourth diagonal directions and upper, lower, left, or right directions that is greater than a width of the light blocking member, and surrounds an outer circumferential surface of the light blocking member in at least one of the first to fourth diagonal directions and the upper, lower, left, or right directions in a plan view.

11. The display device of claim 4, wherein the reflective electrode has a width in at least one of first to fourth diagonal directions and upper, lower, left, or right directions that is greater than a width of the light blocking member, and surrounds an inner circumferential surface of the light blocking member in at least one of the first to fourth diagonal directions and the upper, lower, left, or right directions in a plan view.

12. The display device of claim 4, wherein the reflective electrode has the same width as the light blocking member, has an area that partially overlaps the light blocking member, and protrudes from outer circumferential surfaces of the light blocking member in first to fourth diagonal directions and upper, lower, left, or right directions, and surrounds the outer circumferential surfaces in a plan view.

13. The display device of claim 4, wherein the reflective electrode has the same width as the light blocking member, has an area that partially overlaps the light blocking member, and protrudes from inner circumferential surfaces of the light blocking member in first to fourth diagonal directions and upper, lower, left, or right directions and surrounds the inner circumferential surfaces in a plan view.

14. The display device of claim 4, wherein the reflective electrode has a curved shape that protrudes in at least one of first to fourth diagonal directions and upper, lower, left, and right directions from an outer circumferential surface of the light blocking member in a plan view, and surrounds the outer circumferential surface of the light blocking member with a semicircular shape or a convex curved shape in at least one direction in a plan view.

15. The display device of claim 4, wherein the reflective electrode has a curved shape that protrudes in at least one of first to fourth diagonal directions and upper, lower, left, and right directions from an inner circumferential surface of the light blocking member in a plan view, and surrounds the inner circumferential surface of the light blocking member with a semicircular shape or a convex curved shape in at least one direction in a plan view.

16. The display device of claim 4, wherein the reflective electrode has a circular or polygonal shape, and the circular or polygonal shape protrudes in at least one direction from an outer circumferential surface of a corner of the light blocking member in a plan view, and the circular or polygonal shape surrounds the outer circumferential surface of at least one corner of the light blocking member.

17. The display device of claim 16, wherein the reflective electrode surrounds an inner circumferential surface of the corner of the light blocking member in at least one direction with a sectoral-circular shape.

18. The display device of claim 16, wherein the reflective electrode has a width that is greater than a width of the light blocking member, and the circular or polygonal shaped reflective electrode protrudes from the outer circumferential surface and the inner circumferential surface of at least one corner of the light blocking member in all directions in a plan view, and the circular or polygonal shape surrounds the outer circumferential surface and the inner circumferential surface of at least one corner of the light blocking member.

19. A touch input system, comprising:
a display device that displays an image; and
a touch input device that inputs a touch to the display device,
wherein the display device includes;
a display unit that includes a plurality of light emitting areas;
a plurality of touch electrodes disposed between the plurality of light emitting areas and that sense a touch;
a light blocking member that forms a code pattern by covering a portion of a front surface of at least one of the plurality of touch electrodes with a preset code shape; and
a reflective electrode formed on a rear surface of the light blocking member and that has an area that partially overlaps the light blocking member and reflects light from the touch input device,
wherein the light blocking member covers a portion of the front surface and a portion of a side surface of the at least one touch electrode.

20. The touch input system of claim 19, wherein the touch input device includes:
a code detection unit that detects the code pattern;
a code processor that receives shape data of the code pattern, extracts a data code that corresponds to a shape of the code pattern, and generates coordinate data that correspond to the data code; and
a communication module that transmits the coordinate data to the display device.

21. A touch input system, comprising:
a display device that displays an image and includes a plurality of touch electrodes and light blocking member that forms a code pattern, wherein the light blocking member covers a portion of the front surface and a portion of a side surface of at least one touch electrode of the plurality of touch electrodes; and
a touch input device that inputs a touch to the display device,
wherein the touch input device includes:
a code detection unit that detects the code pattern;
a code processor that receives shape data of the code pattern, extracts a data code that corresponds to a shape of the code pattern, and generates coordinate data that corresponds to the data code; and
a communication module that transmits the coordinate data to the display device.

22. The touch input system of claim 21, wherein the display device includes:
a display unit that includes a plurality of light emitting areas;
a plurality of touch electrodes disposed between the plurality of light emitting areas and that sense a touch; and
a reflective electrode formed on a rear surface of the light blocking member and that has an area that partially overlaps the light blocking member and reflects light from the touch input device,
wherein the light blocking member forms the code pattern by covering a portion of a front surface of at least one of the plurality of touch electrodes with a preset code shape.

* * * * *